(12) United States Patent
Whetsel

(10) Patent No.: US 7,877,650 B2
(45) Date of Patent: Jan. 25, 2011

(54) CORE CIRCUIT TEST ARCHITECTURE

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/716,853

(22) Filed: Mar. 3, 2010

(65) Prior Publication Data

US 2010/0162059 A1 Jun. 24, 2010

Related U.S. Application Data

(62) Division of application No. 12/033,163, filed on Feb. 19, 2008, now abandoned, and a division of application No. 11/051,708, filed on Feb. 4, 2005, now Pat. No. 7,356,745.

(60) Provisional application No. 60/542,410, filed on Feb. 6, 2004.

(51) Int. Cl.
*G01R 31/28* (2006.01)

(52) U.S. Cl. ...................................... 714/726

(58) Field of Classification Search ................ 714/726, 714/724, 733, 734, 30, 729; 716/4
See application file for complete search history.

(56) References Cited

U.S. PATENT DOCUMENTS

| 6,560,734 B1 * | 5/2003 | Whetsel | 714/724 |
|---|---|---|---|
| 6,763,488 B2 * | 7/2004 | Whetsel | 714/729 |
| 7,051,257 B2 * | 5/2006 | Whetsel | 714/729 |
| 7,234,011 B2 * | 6/2007 | Chae | 710/110 |

* cited by examiner

*Primary Examiner*—Phung M Chung
(74) *Attorney, Agent, or Firm*—Lawrence J. Bassuk; W. James Brady; Frederick J. Telecky, Jr.

(57) ABSTRACT

A scan test architecture facilitates low power testing of semiconductor circuits by selectively dividing the serial scan paths into shorter sections. Multiplexers between the sections control connecting the sections into longer or shorted paths. Select and enable signals control the operation of the scan path sections. The output of each scan path passes through a multiplexer to compare circuits on the semiconductor substrate. The compare circuits also receive expected data and mask data. The compare circuits provide a fail flag output from the semiconductor substrate.

3 Claims, 19 Drawing Sheets

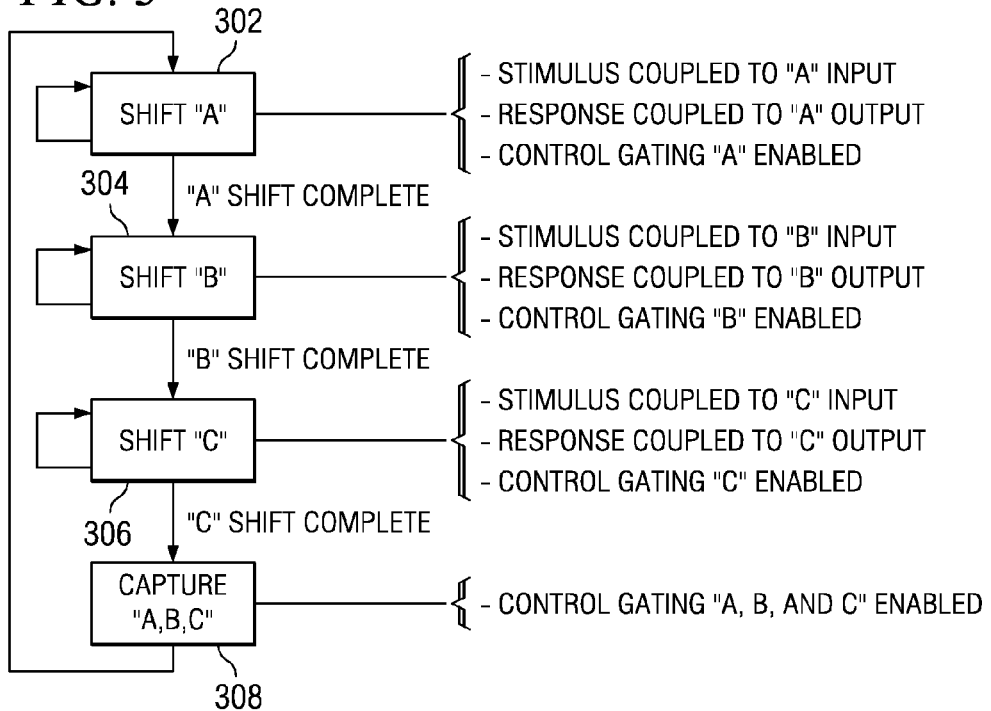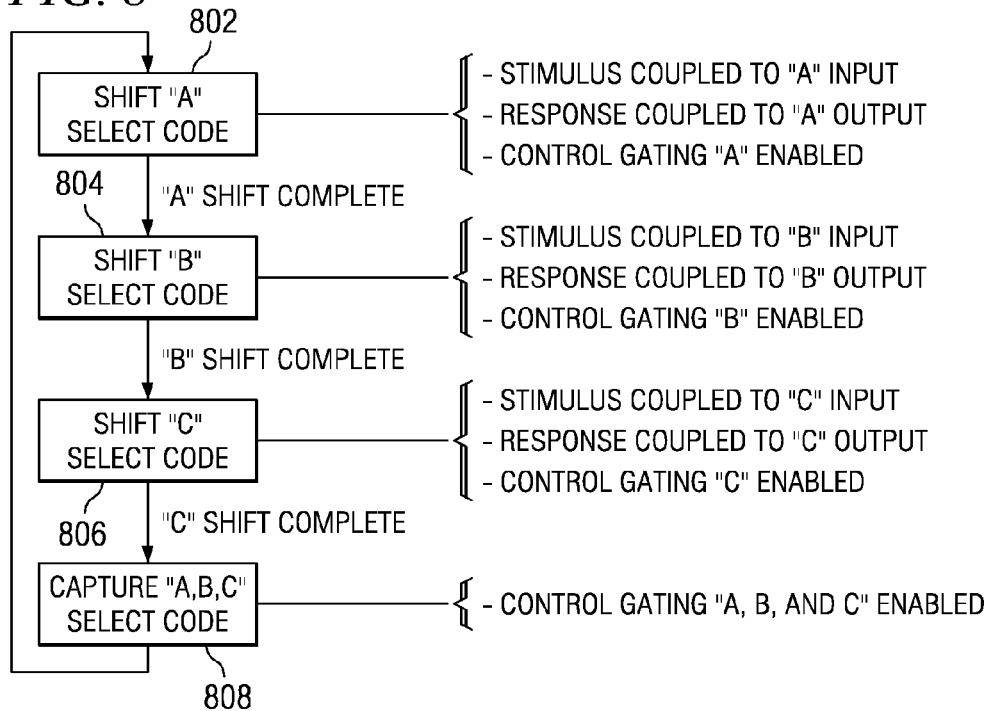

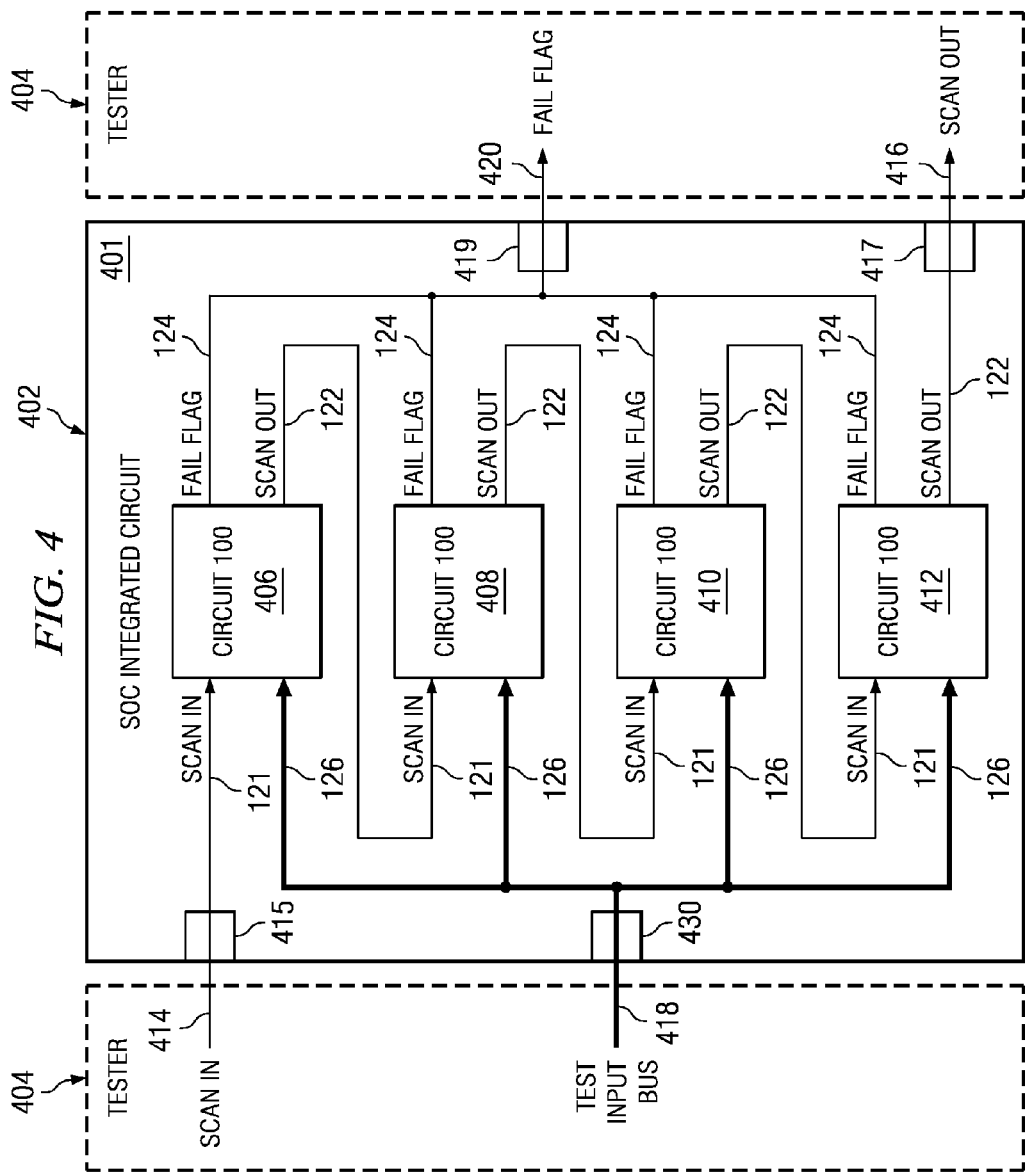

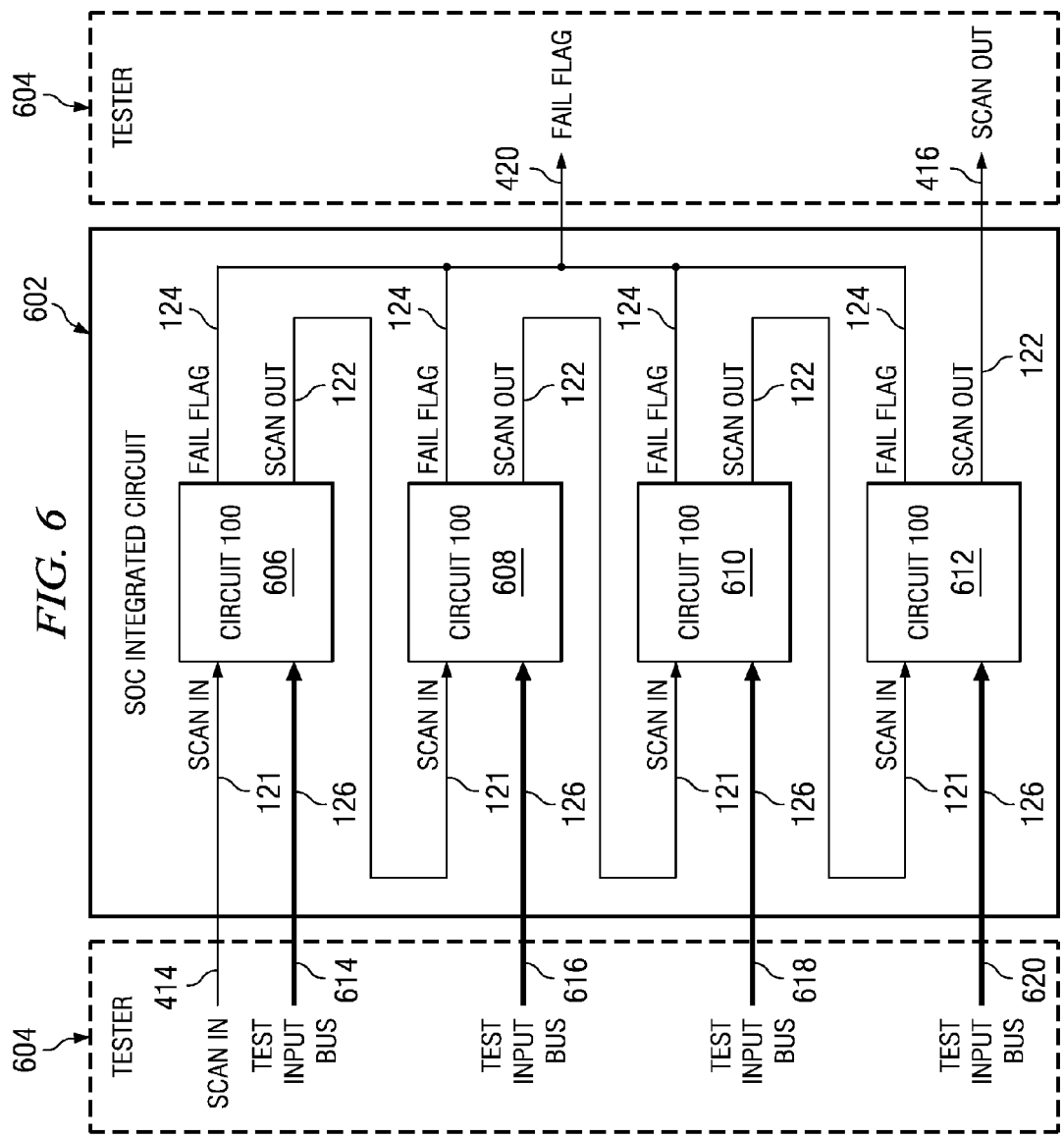

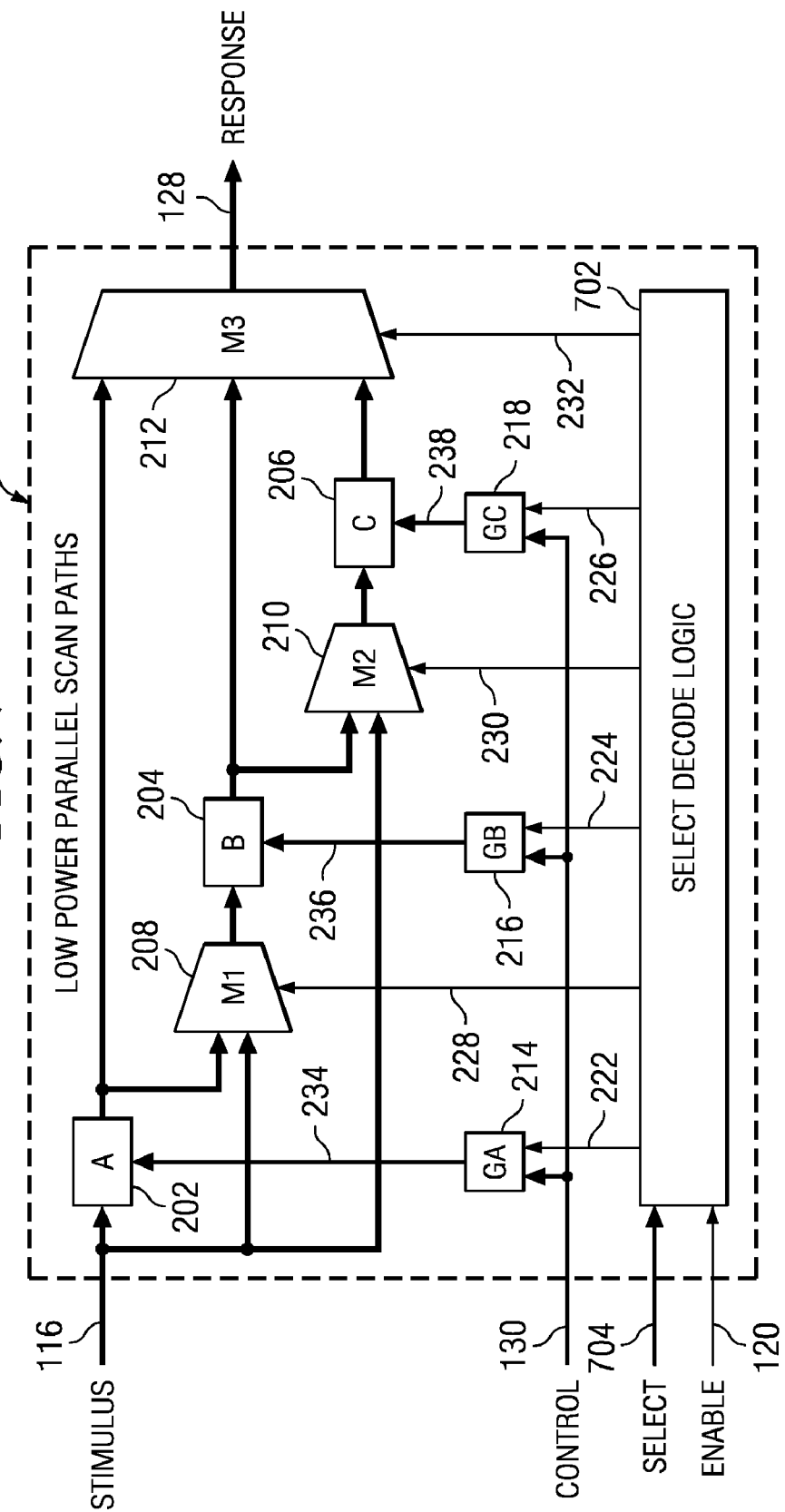

CORE CIRCUIT TEST ARCHITECTURE

RELATED PATENTS/APPLICATIONS

This application is a divisional of prior application Ser. No. 12/033,163, filed Feb. 19, 2008, now abandoned;

This application is a divisional of prior application Ser. No. 11/051,708, filed Feb. 4, 2005, now U.S. Pat. No. 7,356,745, granted Apr. 8, 2008;

Which claims priority from Provisional Application No. 60/542,410, filed Feb. 6, 2004.

This application is related to the following US patents/applications which are incorporated herein by reference.

Application Ser. No. 09/803,599, filed Mar. 9, 2001, now U.S. Pat. No. 6,769,080, issued Jul. 27, 2004.

Application Ser. No. 09/896,467, filed Jun. 29, 2001, now U.S. Pat. No. 6,717,429, issued Apr. 6, 2004.

Application Ser. No. 09/997,462, filed Nov. 29, 2001, now U.S. Pat. No. 6,766,487, issued Jul. 20, 2004.

Application Ser. No. 10/301,898, filed Nov. 22, 2002, now U.S. Pat. No. 6,894,308, issued May 17, 2005.

Application No. 60/542,810, filed Feb. 6, 2004, now application Ser. No. 11/051,696, filed Feb. 4, 2005, abandoned.

BACKGROUND OF THE DISCLOSURE

Technical Field of the Disclosure

This disclosure relates in general to integrated circuit design and testing, and in particular to a circuit test architecture that enables low power testing of embedded circuit core functions using a simplified tester interface.

A System On a Chip (SOC) design may consist of many types of embedded core functions such as DSPs, CPUs, memories, and various other types. Typically the testing of embedded cores is achieved by scan testing the cores. Conventional core scan testing is achieved by placing the core in a test mode whereby scan inputs to the core and scan outputs from the core are made available for access by a tester external to the SOC.

While there are many publications on scan testing, a paper by Marinissen (Scan Chain Design for Test Time Reduction in Core Based ICs", 1998 IEEE International Test Conference) is chosen to provide background information on conventional methods of scan testing cores in an SOC. This paper describes the following three types of core scan test configurations that can be used in an SOC.

The first core scan test configuration described in regard to FIG. 1 of the paper by Marinissen is referred to as a multiplexing architecture. In the multiplexing architecture, the scan inputs of multiple cores are connected to a common scan input bus from a tester while the scan outputs of the multiple cores are individually multiplexed to a common scan out bus to the tester. During test, the tester individually selects one core at a time and tests the core using the scan input and scan output bus. The test is complete after all cores have been individually selected and tested.

The second core scan test configuration described in regard to FIG. 2 of the paper by Marinissen is referred to as a daisychain architecture. In the daisychain architecture, the scan inputs and outputs of multiple individual cores are serially connected to form a daisychained scan path from the tester's scan input to the tester's scan output. During test, the tester accesses the daisychained core scan paths and applies the scan test to the cores. The test is complete after all cores on the daisychain scan path have been tested.

The third core scan test configuration described in regard to FIG. 3 of the paper by Marinissen is referred to as a distribution architecture. In the distribution architecture, the scan inputs and outputs of each core are made individually accessible by a tester. This means that the tester needs to have a scan input and scan output bus dedicated for testing each core. During test, the tester accesses each core's scan input and scan output buses and tests each core in parallel. The test is complete after all cores in the distribution architecture have been tested.

From the above description it is clear that each of the scan test configurations require the tester to receive, either directly as in the multiplexing and distribution architectures or indirectly as in the daisychain architecture, the scan outputs from each core being tested. Having to include circuitry in testers for receiving scan output data from an SOC increases the cost of the tester and leads to larger test access interfaces between the tester and SOC. It should also be clear that the power consumed and heat generated during parallel core testing using the distribution and daisychain configurations may limit the number of cores that may be tested in parallel and force the testing to occur sequentially over a number of smaller core groups. Having to partition a plurality of cores to be tested into small separately tested groups to manage SOC power consumption and heat generation leads to longer test times and increases the cost of the SOC.

SUMMARY OF THE DISCLOSURE

The present disclosure provides a method and apparatus for testing cores in an SOC using lower cost testers that operate to test SOCs using a reduced test access interface between the SOC and tester. In addition, the present disclosure provides a method and apparatus for increasing the number of cores that can be tested in parallel by providing a core circuit test architecture that lowers the power consumption and heat generation during test.

Scan testing of an integrated circuit generally occurs by shifting stimulus data into a serial scan path from a tester, applying the stimulus data to functional circuits, capturing response data in the scan path, and shifting the captured response data out to a tester.

The disclosed scan test architecture facilitates low power testing of semiconductor circuits by selectively dividing the serial scan paths into shorter sections. Multiplexers between the sections control connecting the sections into longer or shorted paths. Select and enable signals control the operation of the scan path sections. The output of each scan path passes through a multiplexer to compare circuits on the semiconductor substrate. The compare circuits also receive expected data and mask data. The compare circuits provide a fail flag output from the semiconductor substrate.

This arrangement selectively provides a standard power mode of operation and a low power mode of operation. In the standard power mode of operation all the scan path sections are shifted at the same time. In the low power mode of operation only one section or less than all the sections are shifted at one time.

BRIEF DESCRIPTION OF THE DRAWINGS

FIG. 3 illustrates a test control sequence for the low power scan path arrangement of FIG. 2 according to the present disclosure.

FIG. 4 illustrates a first example of using the FIG. 1 circuit test architecture in an SOC according to the present disclosure.

FIG. 6 illustrates third example of using the FIG. 1 circuit test architecture in an SOC according to the present disclosure.

FIG. 7 illustrates a second low power scan path arrangement according to the present disclosure.

FIG. 8 illustrates a test control sequence for the low power scan path arrangement of FIG. 7 according to the present disclosure.

DETAILED DESCRIPTION OF THE DISCLOSURE

Figure 1:
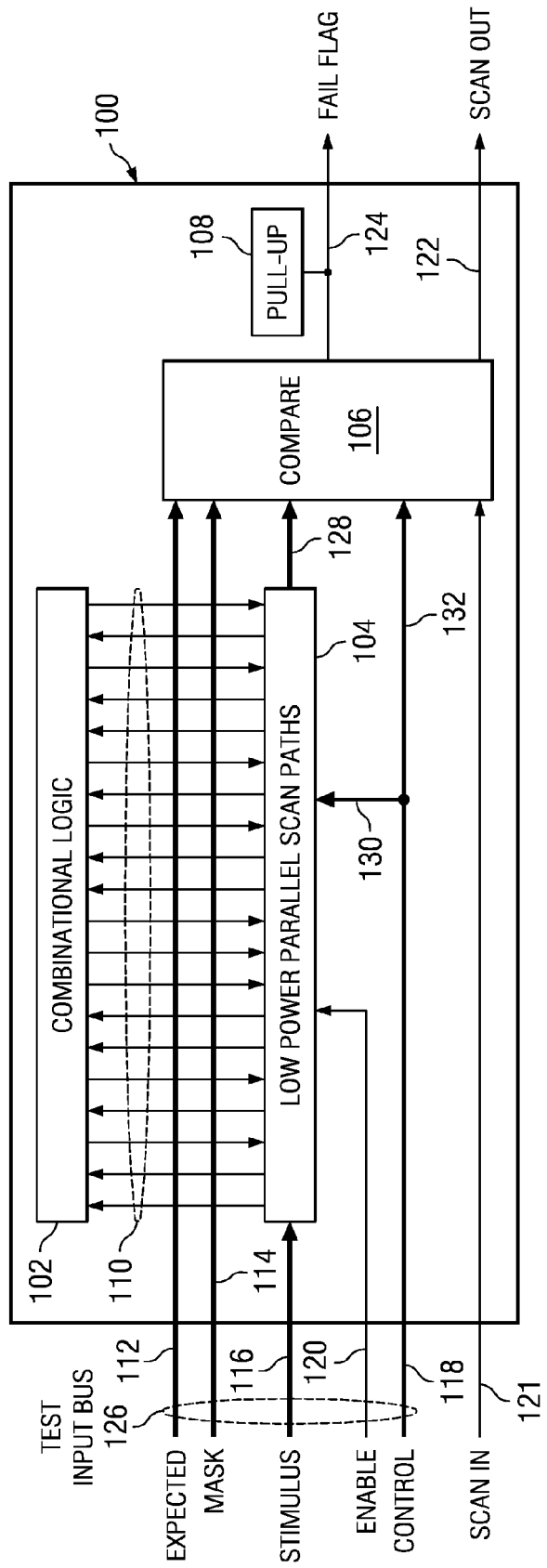
FIG. 1 illustrates a first low power core circuit test architecture according to the present disclosure.

FIG. 1 illustrates a simplified example of a low power core circuit test architecture 100 that enables cores within an SOC to be scan tested in parallel. The functional core circuitry has been placed into a scan test configuration whereby the functional flip flops of the core are converted into low power parallel scan paths 104 that are used to communicate test patterns to and from combinational logic 102 of the core via connections 110.

The test architecture 100 includes compare circuitry 106 at the outputs 128 of the parallel scan paths 104 to allow the test response data 128 from each parallel scan path to be compared with expected data 112 input from a tester. The compare circuitry 106 also contains masking circuitry to allow for mask data 114 input from the tester to selectively mask off certain comparisons between expected data 112 and response data 128 to avoid comparing against unknown response outputs. The compare circuitry 106 is dedicated for use in testing the core of test architecture 100 and accompanies the core when the core is used within an SOC. The expected data input 112, mask data input 114, stimulus data input 116, control input 118, and enable input 120 to circuit 100 are shown to form an test input bus 126 from a tester.

During test, a tester inputs stimulus data 116 to the inputs of the parallel scan paths 104, control 130 from control bus 118 to the control inputs of the scan path 104, and an enable input 120 to the enable input of the scan path. When enabled by enable input 120, the control inputs operate the parallel scan paths in a low power scan mode to shift in and apply stimulus data to combinational logic 102, capture the response data output from combinational logic 102 to the applied stimulus, and to shift out the captured response data to compare circuitry 106. When not enabled by enable input 120, the control inputs still perform the same shift in, capture, and shift out operations but in a conventional scan mode, not the low power scan mode. This will be described later in regard to FIG. 2. Control 132 from control bus 118 is input to the compare circuitry 106 to operate the compare circuitry during test. During test, the compare circuitry 106 matches the response 128 output from the parallel scan paths 104 with expected data 112 input from the tester, unless the match operation is disabled by mask data input 114 from the tester. A signal occurs on the fail flag output 124 whenever a mismatch occurs between the expected and response data to notify the tester of the failure.

Figure 1A:
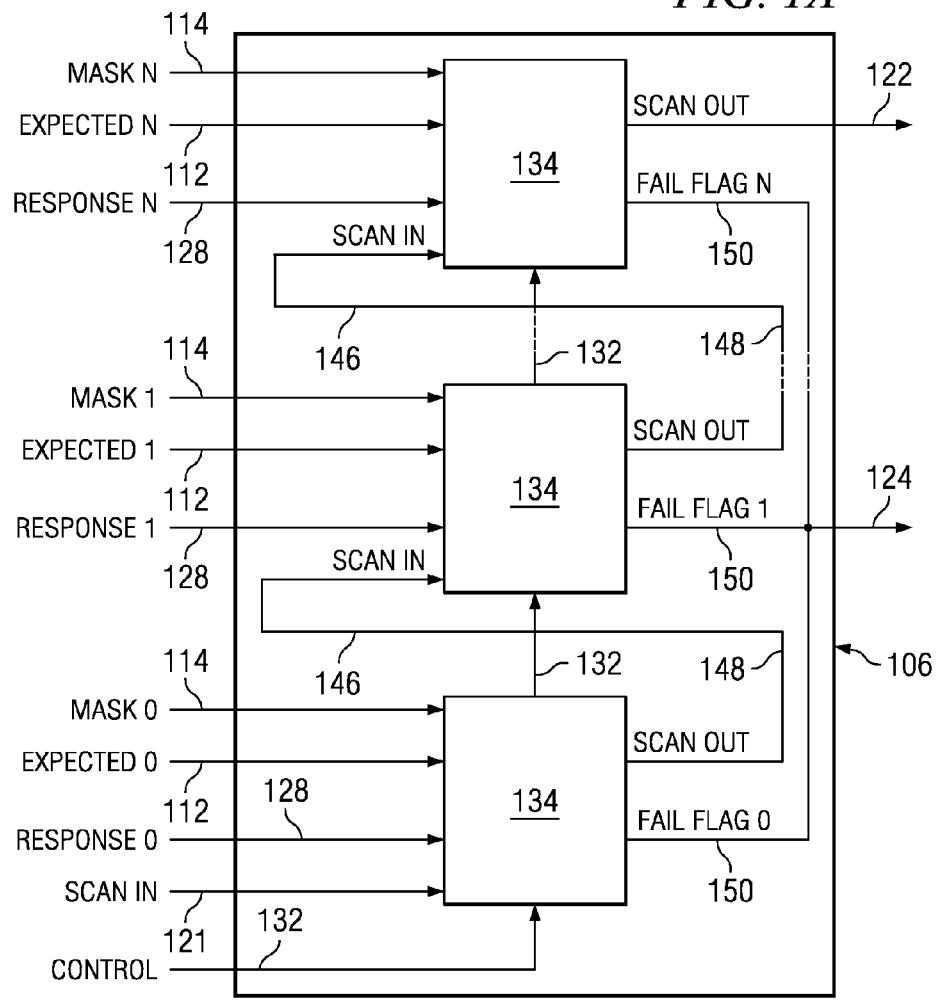
FIG. 1A illustrates the compare circuit of FIG. 1.
Figure 1B:
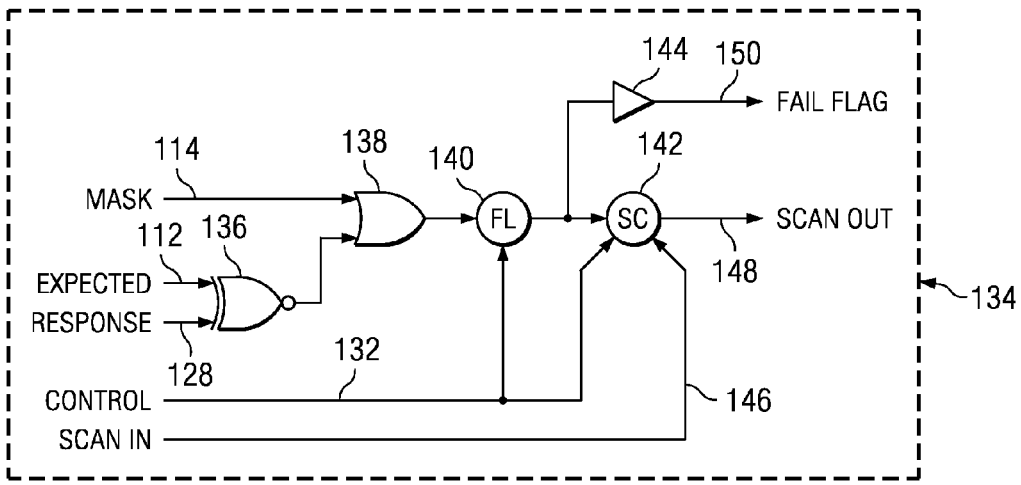
FIG. 1B illustrates a circuit of FIG. 1A.

In FIGS. 1A and 1B, the compare circuitry 106 contains a compare and mask circuit element 134 for each individual parallel scan path output on bus 128. An XNOR gate 136 is provided in the compare and mask element 134 to serve as a comparator between an expected data input 112 from the tester and a response data output 128 from a parallel scan path. An OR gate 138 is provided to mask off the compare result from the XNOR 136 when controlled to do so by mask data input 114 from the tester. A fail latch (FL) 140 is provided to store all compare results output from XNOR 136 that are not masked by OR gate 138. The fail latch 140 is strobed by control from control bus 132 each time response data 128 from the parallel scan paths is compared with expected data 112 from the tester.

A scan cell (SC) 142 is provided to allow capturing the value in the fail latch 140 and shift it out following a test. The scan cell 142 comprises a typical flip flop and multiplexer combination enabling the capturing and shift of data. The scan cell 142 is operated by control from control bus 132. A non-inverting open drain buffer 144 is provided to allow a fail flag output 150 from each compare and mask element 134. The fail flag output 150 serves as an immediate indicator to the tester that a mismatch between expected and response data has occurred and is stored in the fail latch 140.

The open drain buffer 144 is used to allow wire-ORing all fail flag outputs 150 from all compare and mask elements 134 together to produce a wired-OR fail flag output 124 to the tester from compare circuitry 106. A pull up element 108 exists on the wired-OR fail flag 124 to pull the output high. If a failure occurs on any one of the individual fail flag outputs 150, the wired-OR fail flag 124 will be pulled low. The fail flag pull up element 108 may be located internal to or external of architecture 100.

The scan inputs 146 and scan outputs 148 of all compare and mask elements 134 within compare circuitry 106 are serially connected to form the scan path between the scan input 121 and scan output 122 of compare circuitry 106. The tester can access the compare circuitry 106 scan path following a test operation to shift out the pass/or fail values stored in fail latches 140.

In the compare and mask element 134 example, if a mismatch between expected 112 and response 128 data input to XNOR gate 136 occurs, the fail latch 140 will be set to a failure indicating logic zero state which will persist until the end of test. If no mismatches occur during test, the XNOR will output logic ones and the fail latch will remain in the pass indicating logic one state. The fail flag is initialized at the beginning of a test to a logic one by control from control bus 134. A logic one mask input 114 from the tester will force a logic one from OR gate 138 to the fail flag 140 independent of the output of XNOR 136 to achieve the compare masking feature.

The use of compare circuitry in an integrated circuit for the purpose of testing embedded circuits and cores similar to that described above was introduced by referenced U.S. Pat. No. 6,560,734. The use of compare and mask circuitry in an integrated circuit for the purpose of testing embedded circuits and cores similar to that described above was introduced in referenced U.S. patent application Ser. Nos. 09/896,467; 10/301,898; and 60/542,810.

Figure 2:
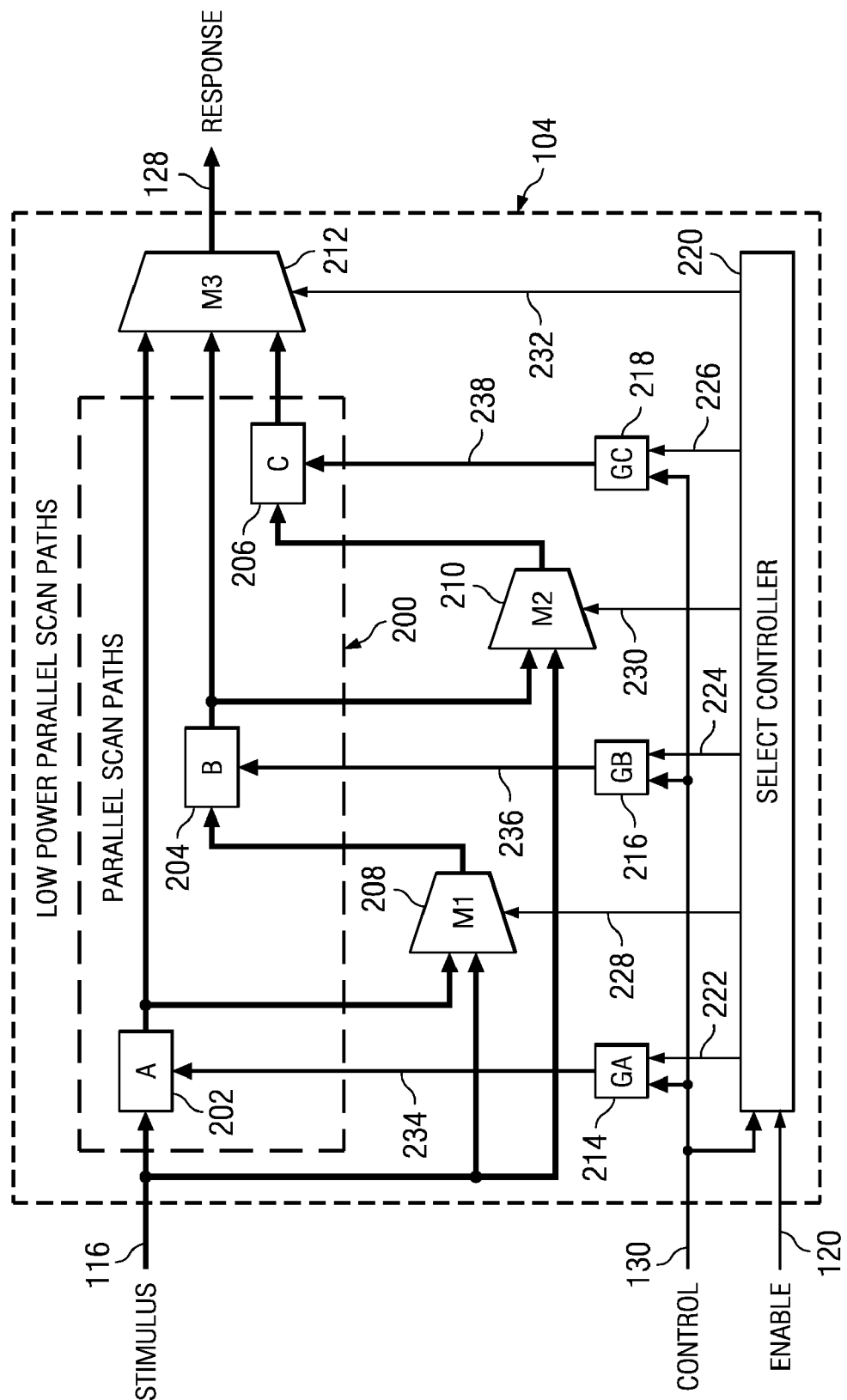
FIG. 2 illustrates a first low power scan path arrangement according to the present disclosure.

FIG. 2 illustrates in more detail the low power scan path 104 of FIG. 1. The low power scan path is constructed by partitioning the overall length of a conventional scan path 200 into multiple separate parallel scan path sections, each section being of equal or near equal length. In this example, three separate sections A 202, B 204, and C 206 have been formed from the original parallel scan path 200. Section A 202 receives the stimulus input bus 116 and outputs to multiplexers 208 and 212. Section B 204 selectively receives input from either stimulus bus 116 or from the scan outputs of section A 202, via multiplexer 208, and outputs to multiplexers 210 and 212. Section C 206 selectively receives input from either the stimulus bus 116 or from the scan outputs from section B 204, via multiplexer 210, and outputs to multiplexer 212.

Section A 202 receives scan control input 234 from gating circuitry 214, section B 204 receives scan control input 236 from gating circuitry 216, and section C 206 receives scan control 238 from gating circuitry 218. Gating circuitry 214, 216, and 218 each receive common scan control input from control bus 132 and each receive separate gating enable inputs 222, 224, and 226 from select controller 220. The select controller 220 also outputs multiplexer controls to multiplexers 208, 210, and 212 on respective leads 228, 230 and 232. Select controller 220 inputs control from control bus 130 and the enable input 120.

During scan test operations when the enable input 120 is set to enable the low power mode of low power scan path 104, each parallel scan path section A, B, and C is accessed separately by controller 220 such that only portions of the overall stimulus data signals on bus 110 to combinational logic 102 change at a time. This method of scanning lowers the power consumption in the combinational logic 102 since only portions of the combinational logic inputs transition at a given time. Also this method of scanning lowers clocking power consumption by only allowing the clocks on buses 234-238 to the currently selected section (i.e. A, B, or C) to operate at a give time.

During scan test operations when the enable input 120 is not set to enable the low power mode of low power scan path 104, each parallel scan path section A, B, and C is connected in series together between stimulus bus 116 and response bus 128, via multiplexers 208, 210, and 212, such that all sections are accessed simultaneously during scan test operations. This mode of operation duplicates the operation of the conventional parallel scan path 200, and, in doing so, does not provide the low power mode of operation described above. To achieve this non-low power mode of operation, the controller 220 is designed such that when the enable signal 120 is not set for low power mode, the enable inputs 222-226 to gating circuitry 214-218 are set to allow all the scan path sections A 202, B 204, and C 206 to receive scan control from bus 130. Also, the inputs to multiplexers 208-212 are all set to concatenate the scan paths sections 202-206 together between stimulus bus 116 and response bus 128.

One reason for selectively providing both a low power and non-low power mode using the enable signal 120 is to provide a method of comparing or benchmarking the actual power consumed during the low power mode of operation against the power consumed during the non-low power mode of operation. Another is that for some SOC designs with only a small number of cores being tested in parallel, power consumption may not be a problem and it may be desirable to simply operate the low power scan path 104 as a conventional scan path 200. Still another reason is that during burn-in it may be desirable to operate the low power scan path 104 in its conventional non-low power mode to actually use scan operations to heat up the SOC during burn-in testing, eliminating the need and cost of burn-in heaters/ovens.

FIG. 3 illustrates one preferred mode of operation of select controller 220, when it is enabled, via enable input 120, for the low power mode of operation of scan path 104. The operation is depicted as a state diagram for controller 220. At the beginning of each scan cycle, the controller enters a state 302 to shift section A 202. In state 302, the stimulus bus 116 inputs to section A, the response bus 228 outputs from section A 202 via multiplexer 212, and section A gating 214 is enabled to pass scan control 130 to section A. When the shifting of section A is complete, the controller enters state 304 to shift section B 204.

In state 304, the stimulus bus 116 inputs to section B 204 via multiplexer 208, the response bus 228 outputs from section B via multiplexer 212, and section B gating 216 is enabled to pass scan control 130 to section B. When the shifting of section B is complete, the controller enters state 306 to shift section C 206. In state 306, the stimulus bus 116 inputs to section C 206 via multiplexer 210, the response bus 228 outputs from section C via multiplexer 212, and section C gating 218 is enabled to pass scan control 130 to section C.

When the shifting of section C is complete, the controller enters state 308 to enable all gating circuits 214-218 to allow all scan path sections A, B, and C to receive control from control bus 130 to capture data from combinational logic 102. From state 308 the controller enters state 302 to repeat the above described low power scan control steps until the test is complete. The controller 220 shift states 302-306 and capture state 308 transitions occur such that the test time of the low power scan path 104 is the same as the conventional non-low power scan path 200.

With the exception of providing selective low power and non-low power modes of operation, the low power scan path structure and operation as described in FIGS. 2 and 3 above is similar to the structure and operation of a low power scan path described in US Patent Application Publication US 2001/0047498 A1, which is incorporated herein by reference.

FIG. 4 illustrates an example whereby a plurality of identical cores 406-412 are embedded within the substrate 401 of a System On a Chip (SOC) integrated circuit 402. Each core includes an identical circuit test architecture 100. Since all the cores 406-412, their test architectures 100, and their test pattern set are identical, a tester 404 may test all the cores in parallel. To achieve this parallel test, the SOC has been designed such that when it is placed in test mode a path is formed on the SOC to allow each test input bus 126 of each circuit test architecture 100 to be coupled to a test input bus 418 from the tester 404. Test input bus 418 connects to test input busses 126 through terminals or bond pads 430 on substrate 401.

Also the serial inputs 121 and serial outputs 122 of each circuit test architecture 100 are serially connected together to form a scan path between a scan input 414 at terminal 415 on substrate 401 from tester 404 and a scan output 416 at terminal 417 to tester 404. Further, the fail flag outputs 124 from each circuit test architecture 100 are wire-ORed together and output at terminal 419 to a fail flag input 420 to tester 404.

Terminals or bond pads 415, 417, 419, and 430 making electrical connections to and from busses or signals on substrate 410 are specifically depicted in FIG. 4. Like terminals or bond pads making like electrical connections on other semiconductor substrates are implied and to be understood, without being specifically shown for simplicity of the drawings, in other structures depicted in the other drawing figures.

During test, the tester inputs common stimulus data 116, mask data 114, expected data 112, control 118, and enable 120 test input patterns to all circuits 100, and monitors the wired-OR fail flag input 420 from the circuits 100. If a failure occurs during the test, as indicated by a fail signal on fail flag input 420, the tester can either continue to test until the test is complete to catch other failures, or halt the test on the occurrence of the first failure. If the test is a pass/fail production test, the tester typically will cease testing on the first occurrence to save tester time.

However, if the test is a diagnostic test, the tester will typically not stop the test on a first failure but rather run the test to its normal completion to test for additional failures that may occur. In either test case, the tester 404 will typically follow up by scanning out the fail flag 140 of each circuit test architecture 100 after the test is complete, or aborted, to identify which one or more of the scan path response outputs 128 failed during the test.

Figure 5:
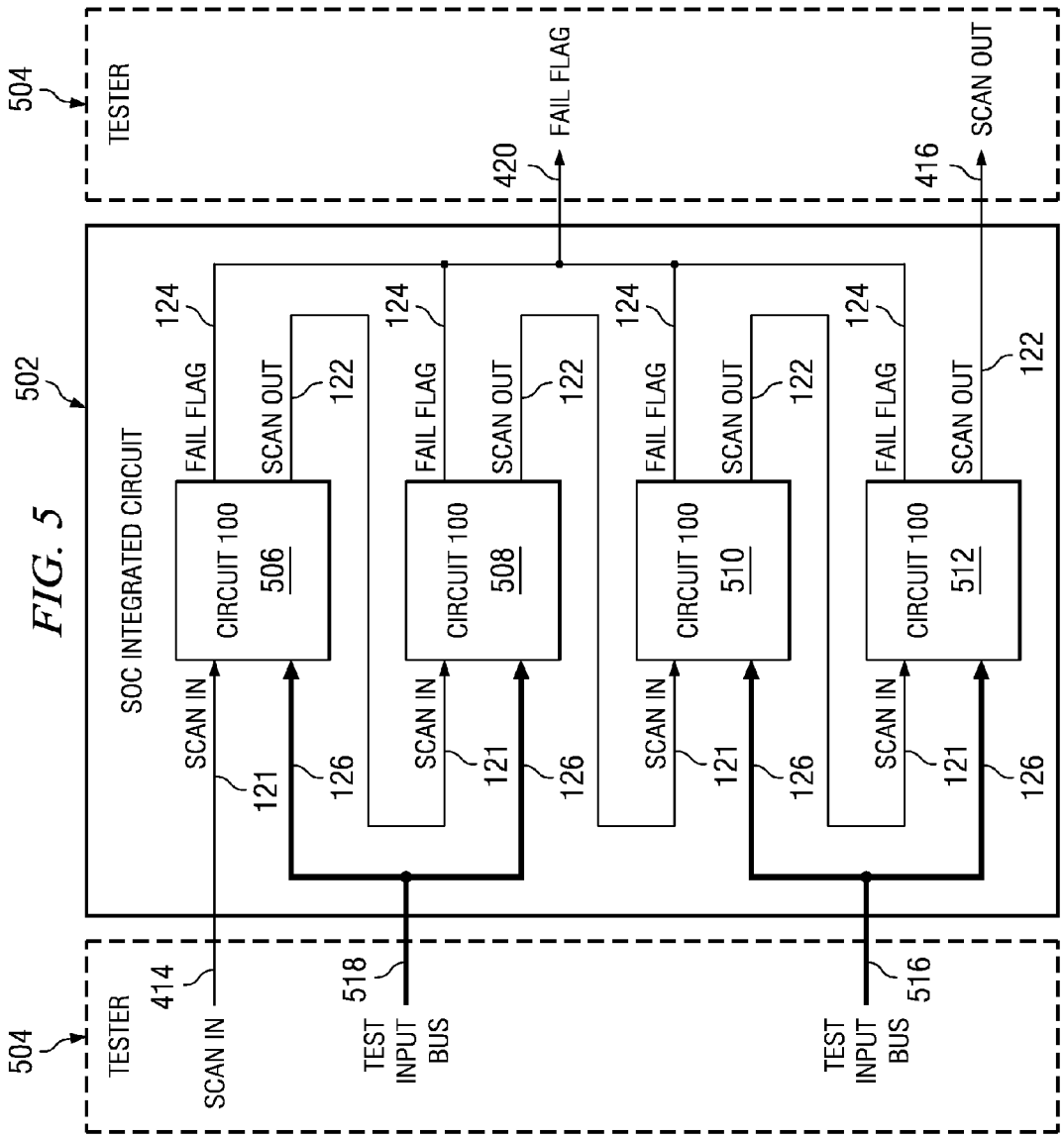
FIG. 5 illustrates second example of using the FIG. 1 circuit test architecture in an SOC according to the present disclosure.

FIG. 5 illustrates an example whereby a first pair of identical cores 506 and 508 and a second pair of identical cores 510 and 512 are embedded within an SOC 502. Identical cores 506 and 508 include an identical circuit test architecture 100. Identical cores 510 and 512 include an identical circuit test architecture 100. Since cores 506 and 508, their test architectures 100, and their test pattern set are identical, tester 504 may test both in parallel. Also, since cores 510 and 512, their test architectures 100, and their test pattern set are identical, tester 504 may test both in parallel.

Further, while the two pairs of cores are different both pairs may be tested in parallel given that the tester 504 has separate test input buses 516 and 518. As seen in FIG. 5, tester test input bus 518 is dedicated to driving the test input buses 126 of the test architectures 100 of cores 506 and 508, and tester test input bus 516 is dedicated to driving the test input buses 126 of test architectures 100 of cores 510 and 512. As in the example of FIG. 4, the fail flag outputs 124 of the test architectures 100 of cores 506-512 are wire-ORed for input to tester 504 via fail flag input 420. Also, as with the example in FIG. 4, the scan inputs 121 and scan outputs 122 of the test architectures 100 of cores 506-512 form a serial path between the tester's scan input 414 and scan output 416.

The testing of each core pair occurs as described in regard to the testing cores in FIG. 4. Since the core pairs are different from one another, one pair may complete its test before the other pair completes its test. If this happens, tester 504 will simply halt the inputting on the test input buses 126 to the core pair that has been tested and continue the inputting on the test input buses 126 to the core pair still being tested. At the end of testing, and if a fail flag signal has been received by the tester 504 on fail flag input 420, the tester will scan out the fail flags 140 from all the tester architectures 100 to determine which core or cores failed the test.

FIG. 6 illustrates an example whereby different cores 606-612 are embedded within an SOC 602. Each different core includes test architecture 100. Since the cores are different, the test input buses 126 of their test architectures 100 must be connected to separate test input buses 614-620 from tester 604. During test, the tester test input buses 614-620 input separate test pattern sets (i.e. separate stimulus, mask, expected, control, and enable signals) to the test input buses 126 of the test architectures 100 of cores 606-612, respectively.

As in the examples of FIGS. 4 and 5, the fail flag outputs 124 of the test architectures 100 of cores 606-612 are wire-ORed for input to tester 504 via fail flag input 420. Also, as with the examples in FIGS. 4 and 5, the scan inputs 121 and scan outputs 122 of the test architectures 100 of cores 606-612 form a serial path between the tester's scan input 414 and scan output 416. The testing of each core occurs as described in regard to the testing cores in FIGS. 4 and 5.

Since the cores are different from one another, one or more cores may complete their test before the other cores completes their test. Again, if this happens, tester 604 will simply halt the inputting on the test input bus 126 to the core(s) that have been tested and continue the inputting on the test input bus 126 to the core(s) still being tested. At the end of testing, and if a fail flag signal has been received by the tester 604 on fail flag input 420, the tester will scan out the fail flags 140 from all the tester architectures 100 to determine which core or cores failed the test.

It is important to note that in the above descriptions of FIGS. 4-6 the tester 404-604 does not receive scan output from the SOC 402-602 during test, since the circuit test architecture 100 does the testing of the low power scan path 104 output response 128 against expected and mask data input on test input bus 126 using compare circuitry 106. Thus, with the exception of the tester having to input the fail flag 420 and scan out 416 signals, the tester is simplified and cost reduced to being an "output only" device to SOC 402-602.

FIG. 7 illustrates an alternative method of designing a low power scan path 700. Low power scan path 700 is identical to the low power scan path 104 of FIG. 2 with the one exception that the multiplexers 208-212 and gating circuitry 214-218 are controlled by select decode logic 702 rather than by select controller 220 of FIG. 2. Also, a select bus 704 has been included for inputting select codes to select decode logic 702. The select decode logic 702 is combinational in operation, i.e. a simple decode circuit. The select decode logic 702 receives input from select bus 704 and from enable 120. When enabled by the enable input 120, the select decode logic 702 inputs select codes from the select bus and decodes the select codes into appropriate multiplexer 208-212 control output 228-232 settings and gating circuitry 214-218 control output 222-226 settings.

During scan test operations when the enable input 120 is set to enable the low power mode of low power scan path 700, each parallel scan path section A, B, and C is accessed separately by select codes input to select decode logic 702 such that only portions of the overall stimulus data signals on bus 110 to combinational logic 102 change at a time. As mentioned in regard to the low power scan path 104 of FIG. 2, this method of scanning reduces power consumption in the combinational logic and in the clock trees feeding the scan paths sections A, B, and C.

During scan test operations when the enable input 120 is not set to enable the low power mode of low power scan path 700, each parallel scan path section A, B, and C is connected in series together between stimulus bus 116 and response bus 128, via multiplexers 208, 210, and 212, such that all sections are accessed simultaneously during scan test operations. This mode of operation duplicates the operation of the conventional parallel scan path 200, and, in doing so, does not provide the low power mode of operation described above. To achieve this non-low power mode of operation, the select decode logic 702 is designed such that when the enable signal 120 is not set for low power mode, the enable inputs 222-226 to gating circuitry 214-218 are set to allow all the scan path sections 202-206 to receive scan control from bus 130. Also, the inputs to multiplexers 208-212 are all set to concatenate the scan paths sections 202-206 together between stimulus bus 116 and response bus 128.

The reasons for selectively providing both a low power and non-low power mode using the enable signal 120 has been previously described in regard to the low power scan path of FIG. 2.

FIG. 8 illustrates one preferred mode of operation of select decoder logic 702, when it is enabled, via enable input 120, for the low power mode of operation of scan path 104. The operation is depicted as a sequence of actions that take place in response to select code inputs 802-808 on select bus 704. At the beginning of each scan cycle, in box 802, a shift A select code is input to cause select decoder logic 702 to output control to enable operation of or shifting of data in shift section A between stimulus bus input 116 and response bus output 128. Next, in box 804, a shift B select code is input to cause the select decoder logic 702 to enable operation of or shifting of data in shift section B between stimulus bus input 116 and response bus output 128. Next, in box 806, a shift C select code is input to cause the select decoder logic 702 to enable operation of or shifting of data in shift section C between stimulus bus input 116 and response bus output 128. Next, in box 808, a capture A, B, C select code is input to cause the select decoder logic 702 to enable operation of all sections A, B, and C to capture data from combinational logic 102 via connection path 110.

The above described select code input sequence is repeated until testing of combinational logic 102 is complete. The select decoder logic 702 is capable of responding to the sequence of select code inputs of boxes 802-808 such that the test time of the low power scan path 700 is the same as the conventional non-low power scan path 200.

With the exception of providing selective low power and non-low power modes of operation, the low power scan path structure and operation as described in FIGS. 7 and 8 above is similar to the structure and operation of a low power scan path described in pending US patent application publication US 2002/0104050 A1, which is incorporated herein by reference.

Figure 9:
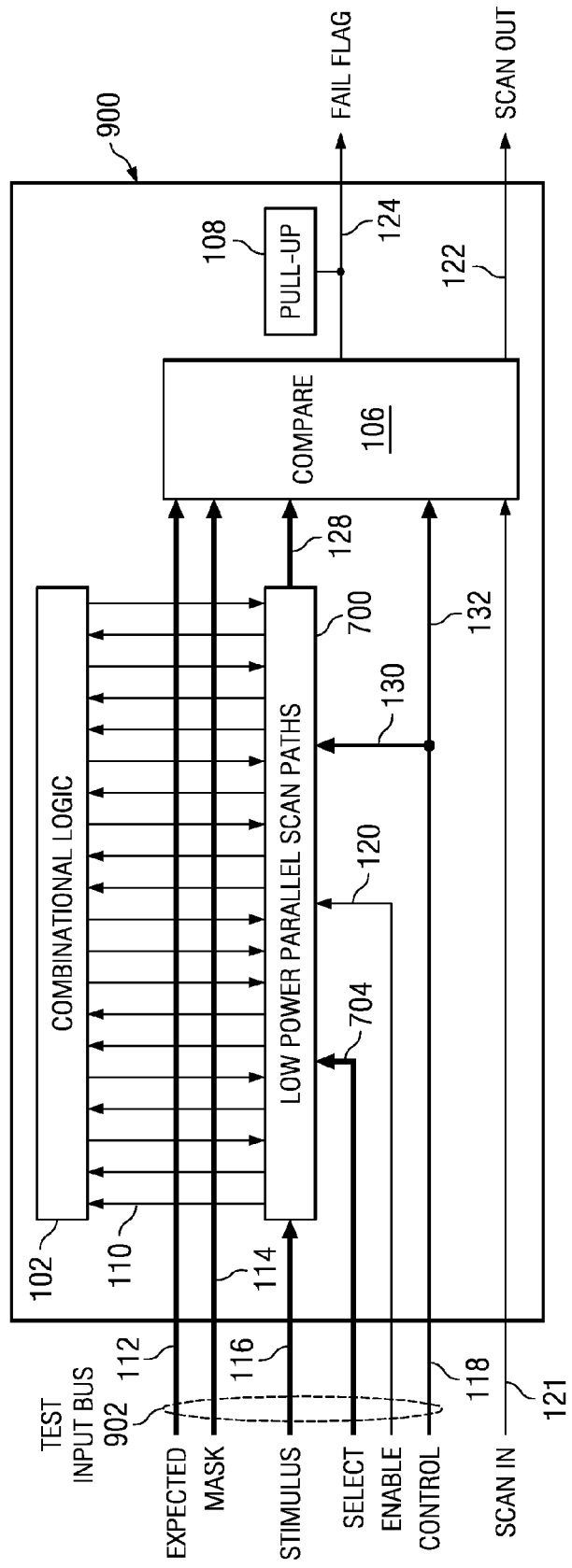
FIG. 9 illustrates a second low power core circuit test architecture according to the disclosure.

FIG. 9 illustrates the core circuit test architecture 900 of FIG. 1 when the low power scan path 700 is substituted for the low power scan path 104. With the exception of using low power scan path 700 instead of low power scan path 104 and the addition of select bus 704 for inputting the select codes to low power scan path 700, the structure and operation of the circuit test architecture 900 is identical to that of test architecture 100. The test input bus 902 of circuit test architecture 900 differs from test input bus 126 only in that the select bus 704 is included as additional test input signals.

One advantage circuit test architecture 900 has over circuit test architecture 100 is that the select code inputs to the select decoder logic 702 can be altered to allow for changing the shifting order of sections A, B, and C. For example, if it is desired to reverse the shifting order of sections A, B, and C shown in FIG. 8 to say a shifting order where the sections are shifted in reverse, i.e. C, B, then A, all that is necessary is to reverse the select code input sequence on select bus 704 to the select decoder logic 702. Indeed, any desired shifting order of sections A, B, and C can be achieved simply by altering the select code input sequence. This flexibility is not provided in the low power scan path 104 since the shifting order is fixed by the design of the select controller 220.

One disadvantage circuit test architecture 900 has that circuit test architecture does not have is that it requires additional inputs from the tester to supply the select code inputs to select decoder logic 702. Thus when testing must be done by a tester with a minimum of output signals, or if it is desired to minimize the test interface signals between the tester and SOC, circuit test architecture 100 may be preferred over circuit test architecture 900.

Figure 10:
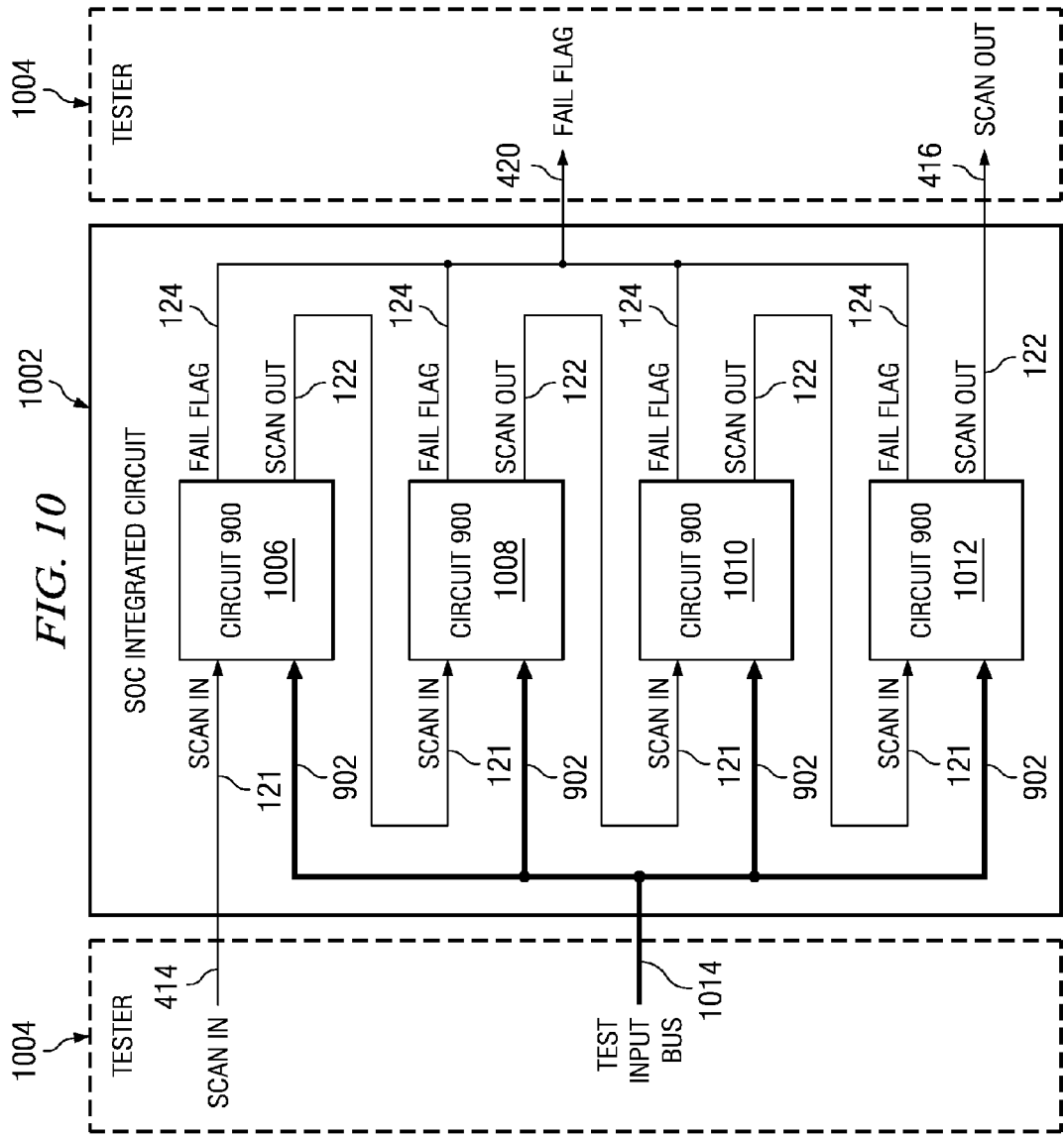
FIG. 10 illustrates a first example of using the FIG. 9 circuit test architecture in an SOC according to the present disclosure.

FIG. 10 is provided to indicate that circuit test architectures 900 can be used in SOC 1002 to test identical cores 1006-1012 as circuit test architectures 100 were used in SOC 402 to test identical cores 406-412 in FIG. 4. The only difference being that a tester 1004 is provided with a test input bus 1014 for inputting to the test input buses 902 of circuits 900.

Figure 11:
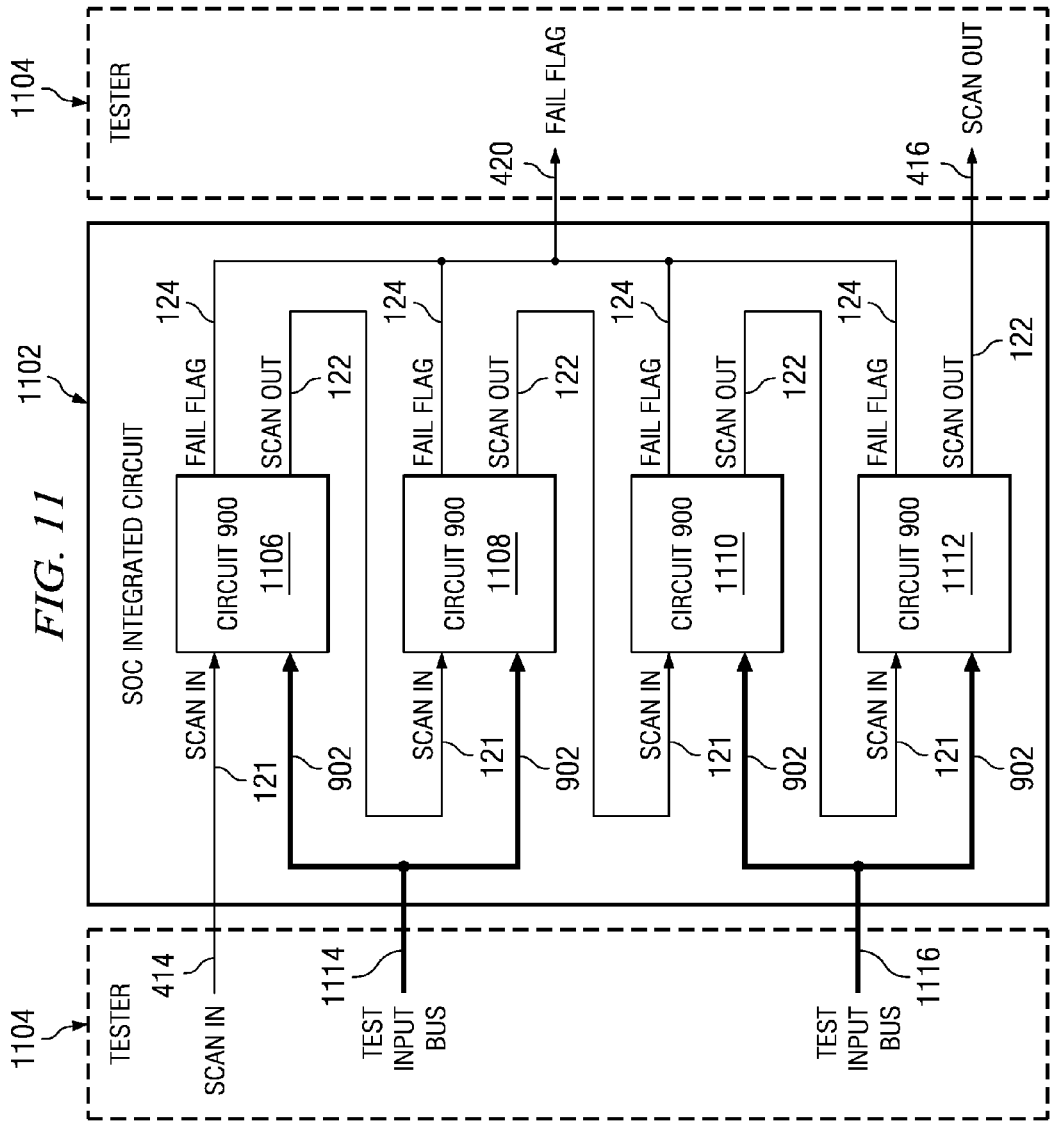
FIG. 11 illustrates second example of using the FIG. 9 circuit test architecture in an SOC according to the present disclosure.

FIG. 11 is provided to indicate that circuit test architectures 900 can be used in SOC 1102 to test identical core pair 1106 and 1108 and identical core pair 1110 and 1112 as circuit test architectures 100 were used in SOC 502 to test identical core pair 506 and 508 and identical core pair 510 and 512 in FIG. 5. The only difference being that a tester 1104 is provided with a first test input bus 1114 for inputting to the test input buses 902 of core pair 1106 and 1108, and a second test input bus 1116 for inputting to the test input buses 902 of core pair 1110 and 1112.

Figure 12:
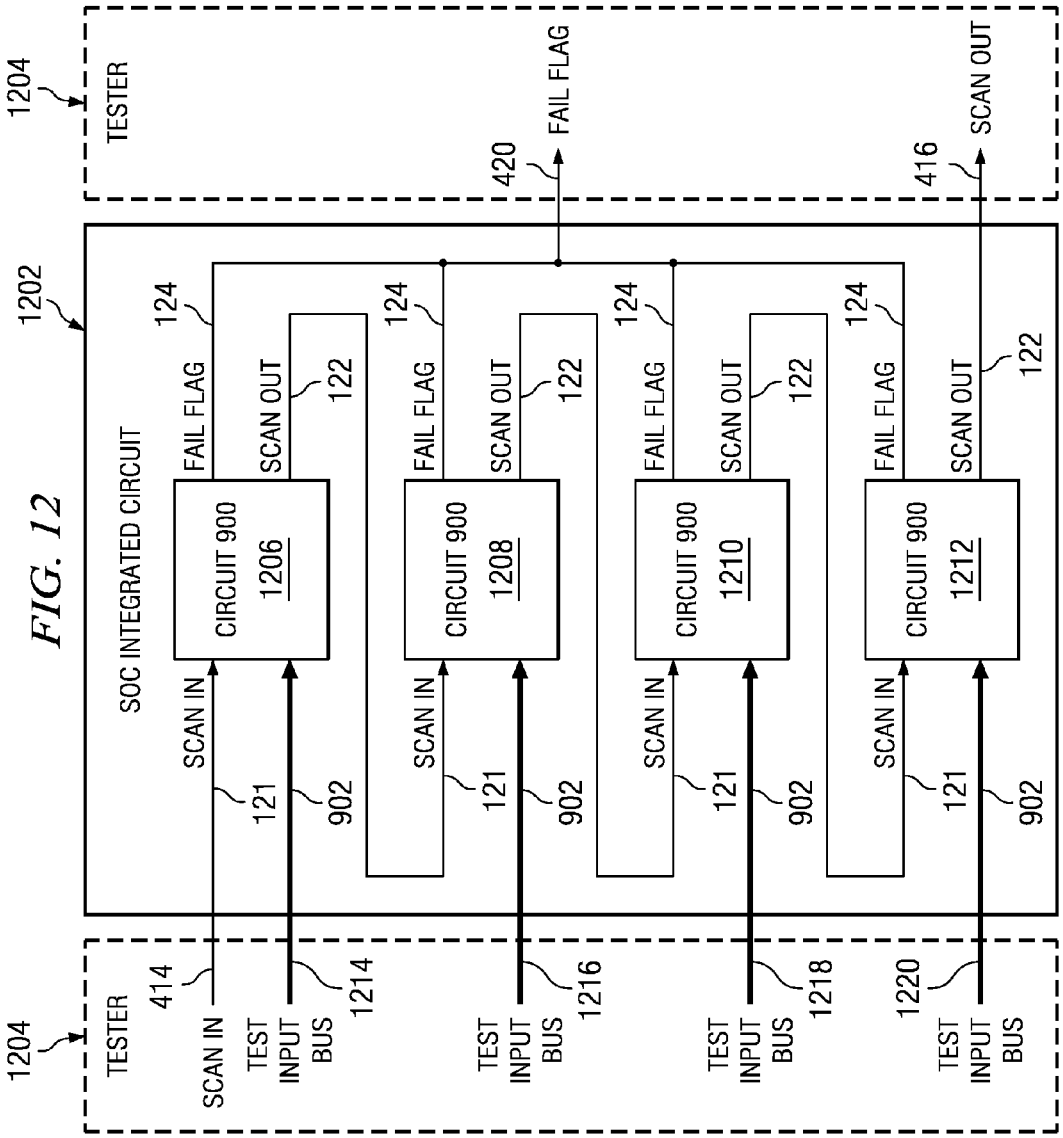
FIG. 12 illustrates third example of using the FIG. 9 circuit test architecture in an SOC according to the present disclosure.

FIG. 12 is provided to indicate that circuit test architectures 900 can be used in SOC 1202 to test different type cores 1206, 1208, 1210, and 1212 as circuit test architectures 100 was used in SOC 602 to test different cores 606, 608, 610, and 612 in FIG. 6. The only difference being that a tester 1204 is provided with separate test buses 1214, 1216, 1218, and 1220 for individually inputting to the test input buses 902 of cores 1206, 1208, 1210, and 1212, respectively.

Figure 13:
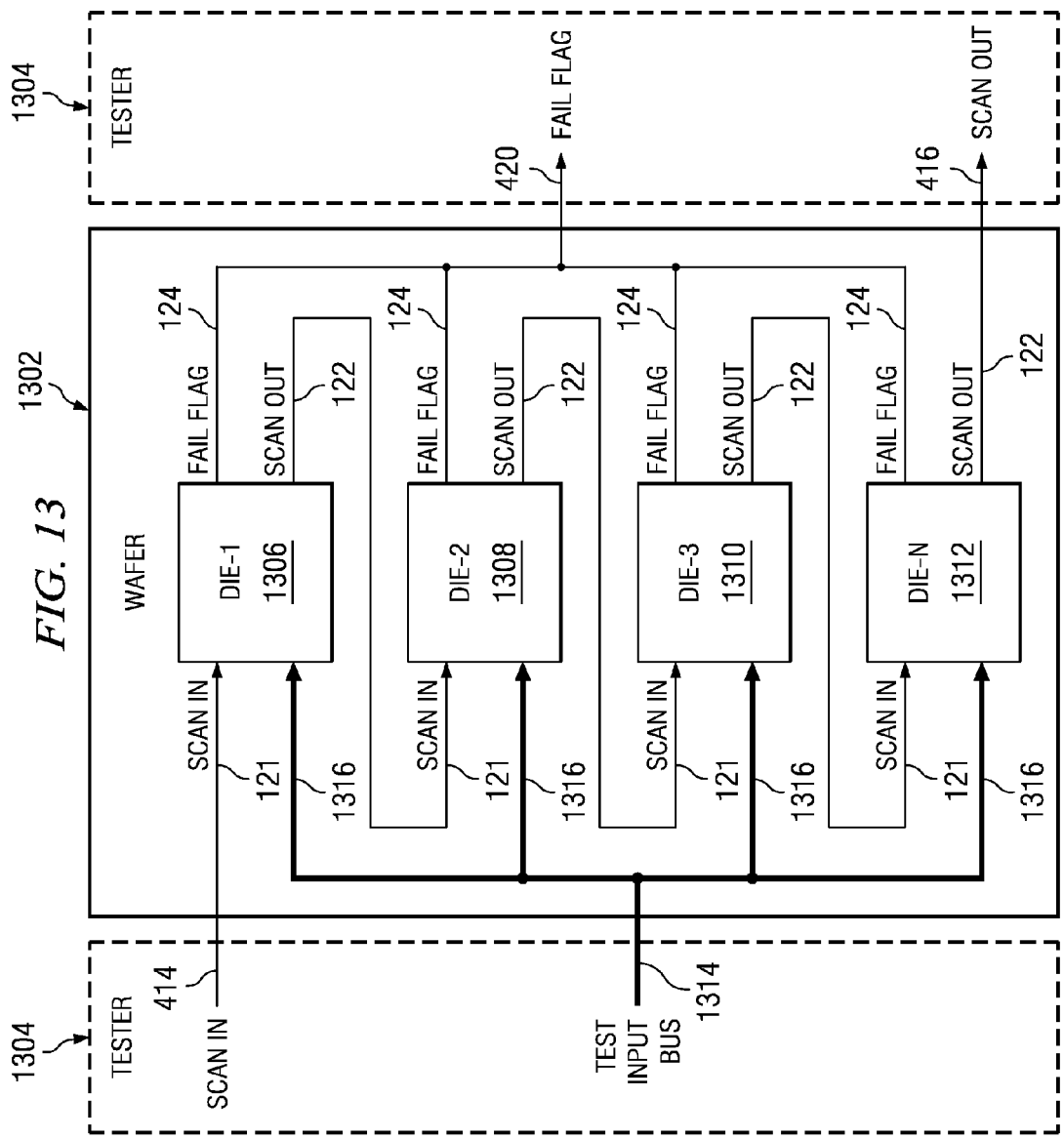
FIG. 13 illustrates an example of testing a plurality of SOC die on wafer using the low power core circuit test architectures of FIGS. 4 and 10 according to the present disclosure.

FIG. 13 illustrates how the present disclosure is advantageously used to parallel test multiple die 1306-1312 on a wafer 1302, each die containing either FIG. 4 cores 406-412 with test architectures 100 or FIG. 10 cores 1006-1012 with test architectures 900. The test is the same as previously described for the single SOC of FIGS. 4 and 10. The only difference is that the tester 1302 has a test input bus 1314 capable of driving the test input buses 1316 of the multiple die 1306-1312. If the die use test architecture 100 of FIG. 4, the test input bus 1316 will be test input bus 126 and the tester test input bus 1314 will be test input bus 418. If the die use test architecture 900 of FIG. 10, the test input bus 1316 will be test input bus 902 and the tester test input bus 1314 will be test input bus 1014.

Figure 14:
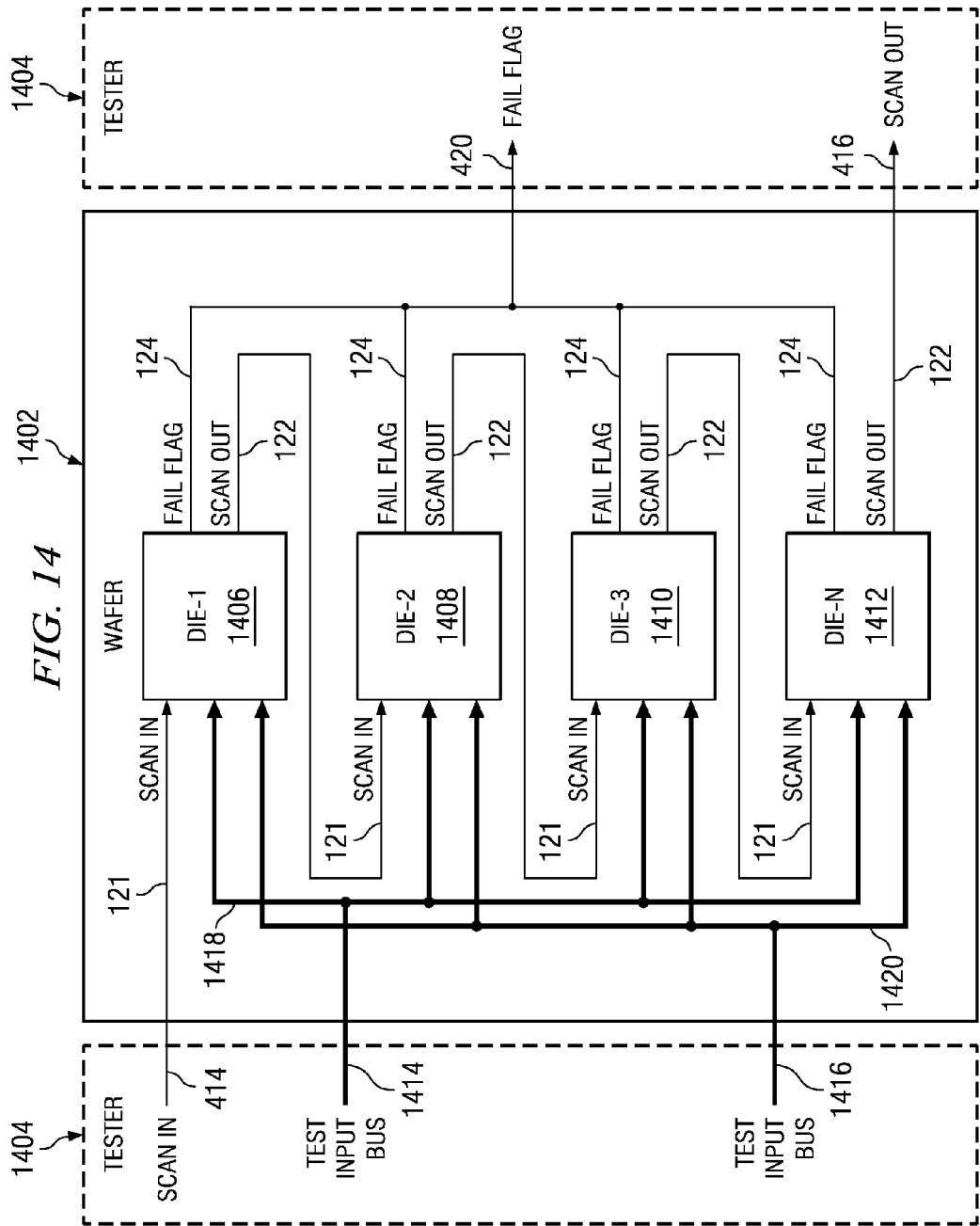
FIG. 14 illustrates an example of testing a plurality of SOC die on wafer using the low power core circuit test architectures of FIGS. 5 and 11 according to the present disclosure.

FIG. 14 illustrates how the present disclosure is advantageously used to parallel test multiple die 1406-1412 on a wafer 1402, each die containing either FIG. 5 core pairs 506,508 and 510,512 with test architectures 100 or FIG. 11 core pairs 1106,1108 and 1110,1112 with test architectures 900. The test is the same as previously described for the single SOC of FIGS. 5 and 11. The only difference is that the tester 1402 has test input buses 1414 and 1416 capable of driving the test input buses 1418 and 1420, respectively, of the multiple die 1406-1412. If the die use test architecture 100 of FIG. 5, the test input buses 1418 and 1420 will be test input buses 126 and the tester test input buses 1414 and 1416 will be test input buses 508 and 506. If the die use test architecture 900 of FIG. 11, the test input buses 1418 and 1420 will be test input buses 902 and the tester test input buses 1414 and 1416 will be test input buses 1114 and 1116.

Figure 15:
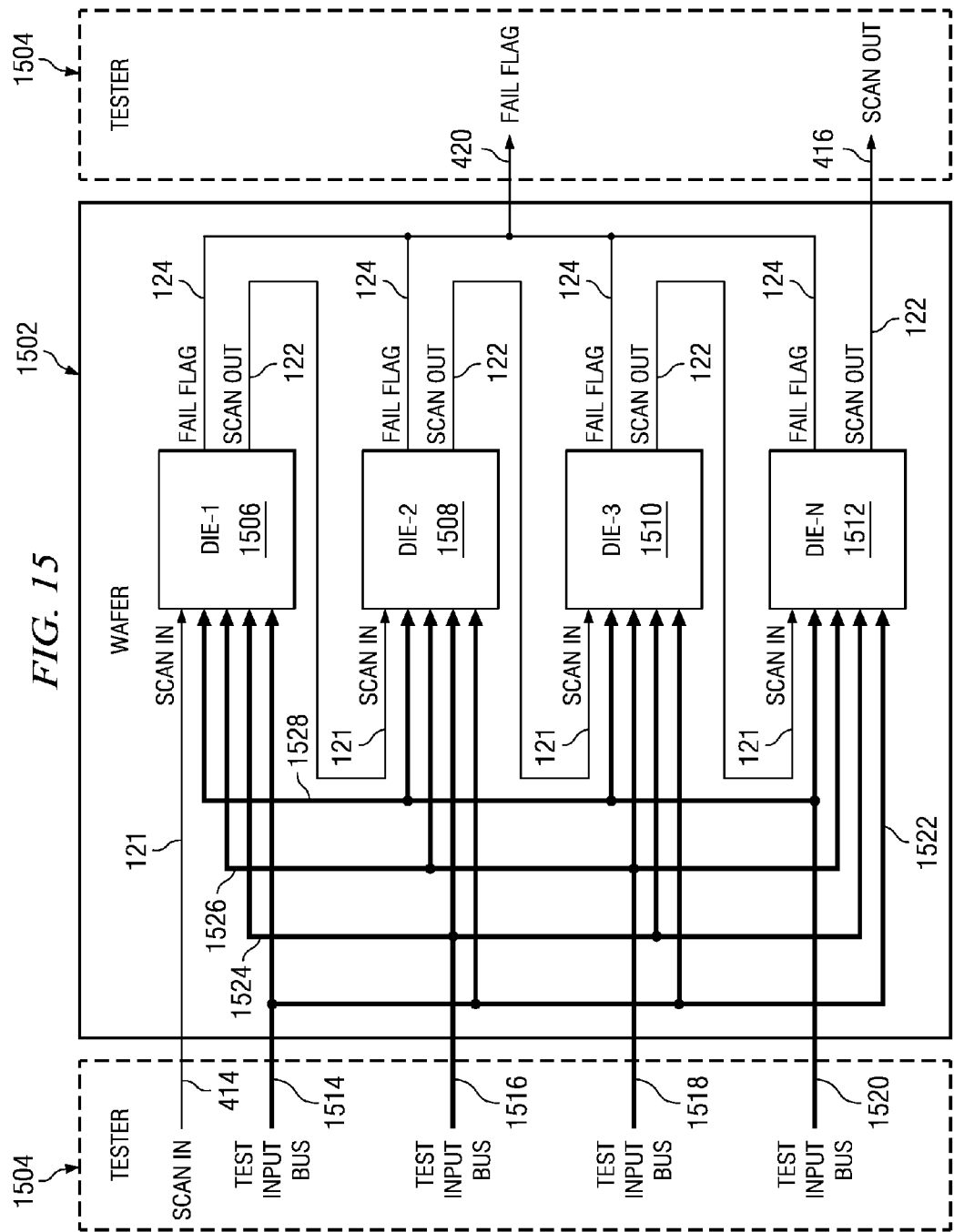
FIG. 15 illustrates an example of testing a plurality of SOC die on wafer using the low power core circuit test architectures of FIGS. 6 and 12 according to the present disclosure.

FIG. 15 illustrates how the present disclosure is advantageously used to parallel test multiple die 1506-1512 on a wafer 1502, each die containing either FIG. 6 cores 606-612 with test architectures 100 or FIG. 12 cores 1206-1212 with test architectures 900. The test is the same as previously described for the single SOC of FIGS. 6 and 12. The only difference is that the tester 1502 has test input buses 1514-1520 capable of driving the test input buses 1522-1528, respectively, of the multiple die 1506-1512. If the die use test architecture 100 of FIG. 6, the test input buses 1522-1528 will be test input buses 126 and the tester test input buses 1514-1520 will be test input buses 614-620. If the die use test architecture 900 of FIG. 12, the test input buses 1522-1528 will be test input buses 902 and the tester test input buses 1514-1520 will be test input buses 1214-1220.

Figure 16:
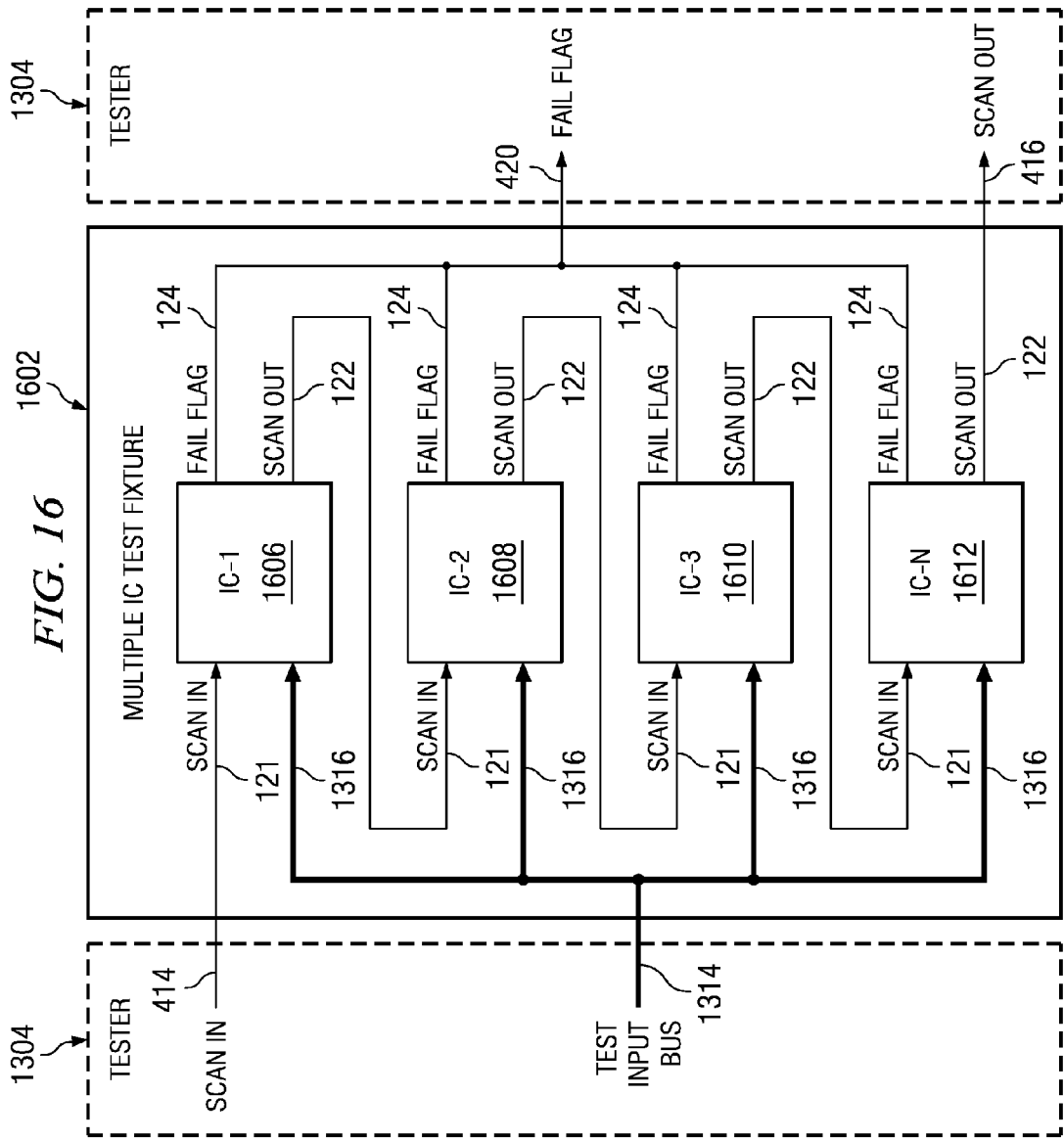
FIG. 16 illustrates an example of testing a plurality of packaged ICs on a multiple IC test fixture using the low power core circuit test architectures of FIGS. 4 and 10 according to the present disclosure.

FIG. 16 illustrates how the present disclosure is advantageously used to parallel test multiple packaged ICs 1606-1612 on a multiple IC test fixture 1602. For simplification, it is assumed that the ICs 1606-1612 in FIG. 16 are simply the die 1306-1312 of FIG. 13 that have passed the wafer level test of FIG. 13, been singulated, and assembled into the packaged ICs 1606-1612 of FIG. 16. The test applied to the die 1306-1312 on wafer 1302 in FIG. 13 is simply repeated to test the packaged ICs 1606-1612 on test fixture 1602 of FIG. 16.

Figure 17:
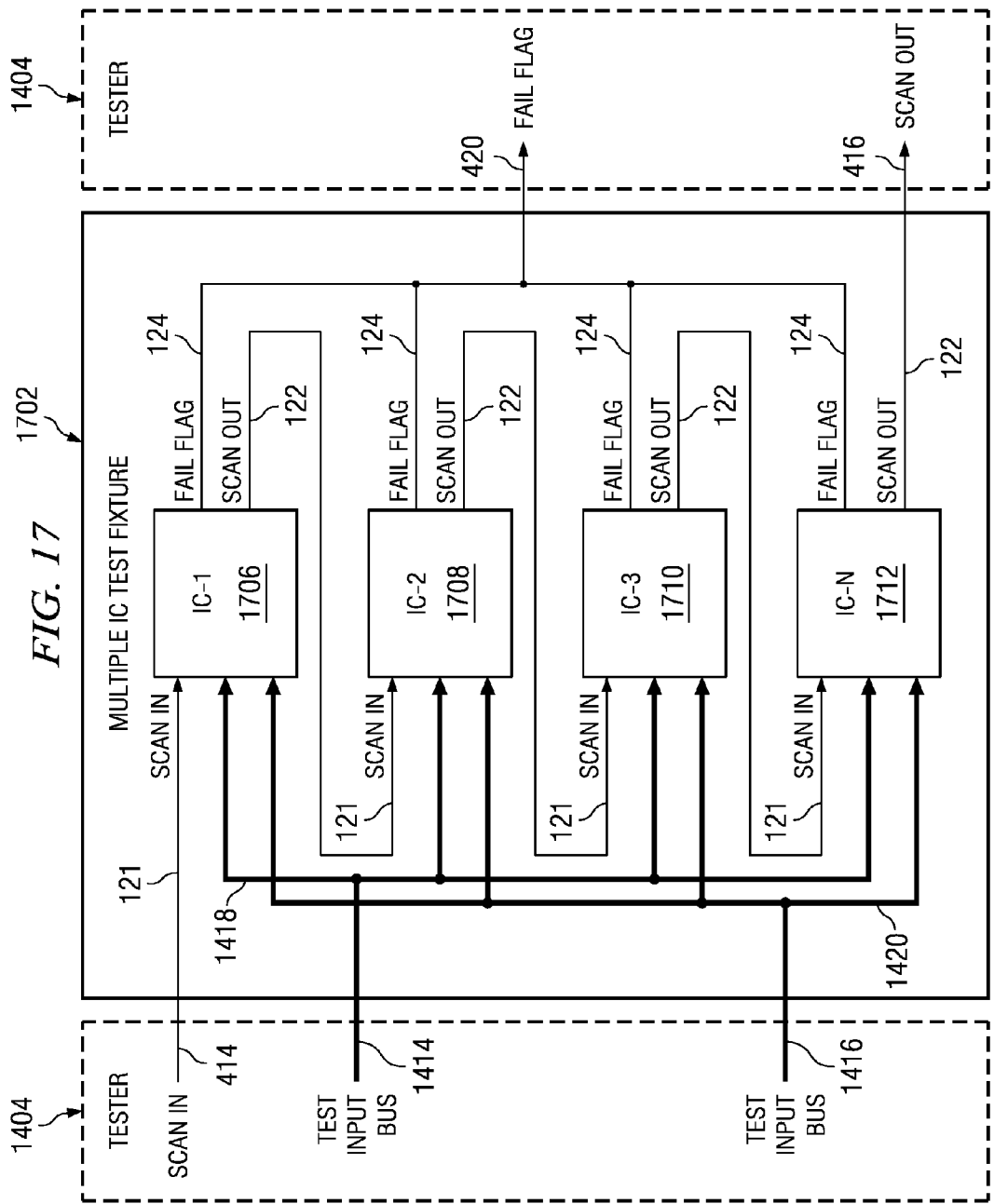
FIG. 17 illustrates an example of testing a plurality of packaged ICs on a multiple IC test fixture using the low power core circuit test architectures of FIGS. 5 and 11 according to the present disclosure.

FIG. 17 illustrates how the present disclosure is advantageously used to parallel test multiple packaged ICs 1706-1712 on a multiple IC test fixture 1702. Again for simplification, it is assumed that the ICs 1706-1712 in FIG. 17 are simply the die 1406-1412 of FIG. 14 that have passed the wafer level test of FIG. 14, been singulated, and assembled into the packaged ICs 1706-1712 of FIG. 17. Again, the test applied to the die 1406-1412 on wafer 1402 in FIG. 14 is simply repeated to test the packaged ICs 1706-1712 on test fixture 1702 of FIG. 17.

Figure 18:
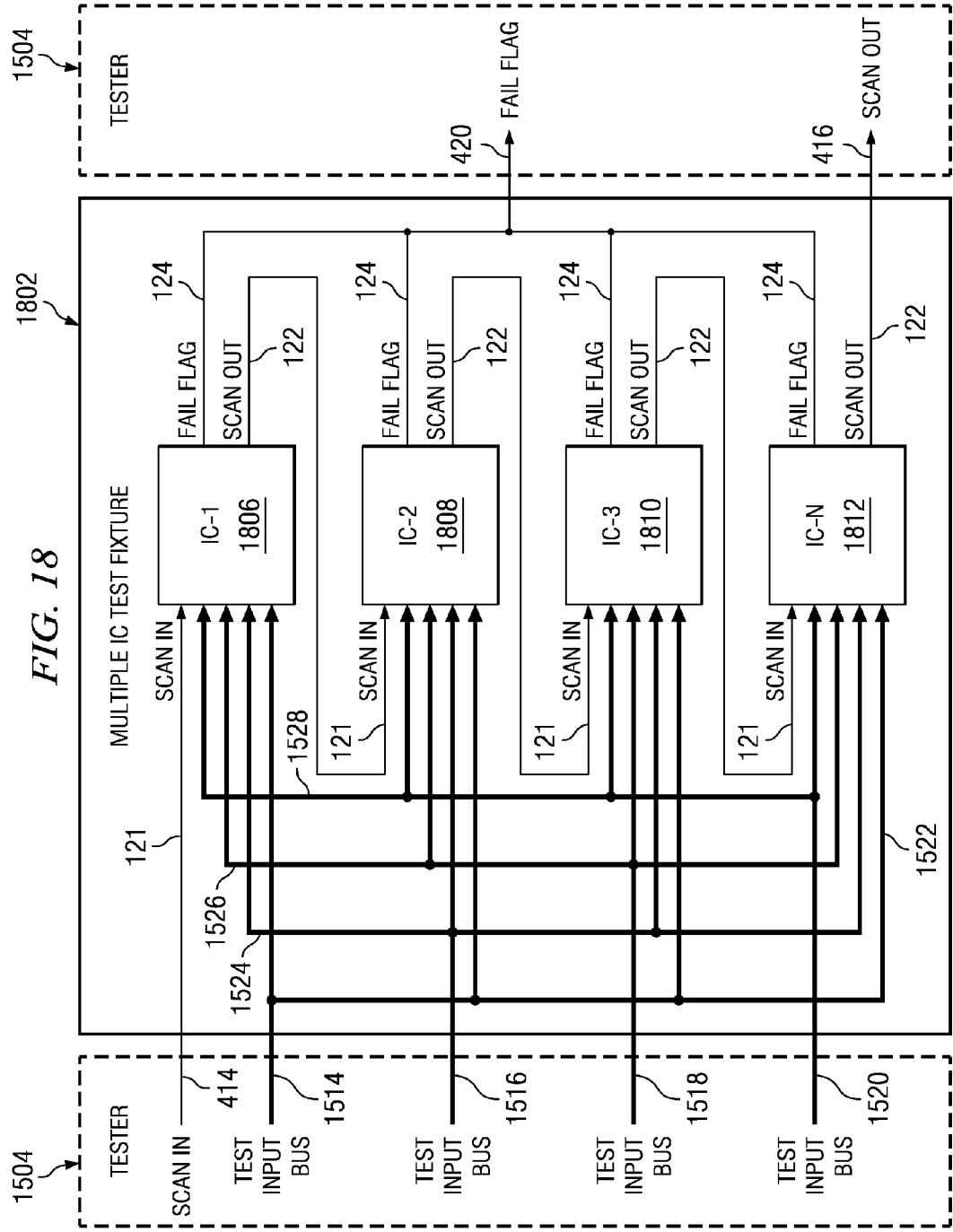
FIG. 18 illustrates an example of testing a plurality of packaged ICs on a multiple IC test fixture using the low power core circuit test architectures of FIGS. 6 and 12 according to the present disclosure.

FIG. 18 illustrates how the present disclosure is advantageously used to parallel test multiple packaged ICs 1806-1812 on a multiple IC test fixture 1802. Again for simplification, it is assumed that the ICs 1806-1812 in FIG. 18 are simply the die 1506-1512 of FIG. 15 that have passed the wafer level test of FIG. 15, been singulated, and assembled into the packaged ICs 1806-1812 of FIG. 17. Again, the test applied to the die 1506-1512 on wafer 1502 in FIG. 15 is simply repeated to test the packaged ICs 1806-1812 on test fixture 1802 of FIG. 18.

It is important to note in FIGS. 13-18 that the present disclosure allows for; (1) the same low cost tester 1304 to test both the die 1306-1312 of FIG. 13 and the ICs 1606-1612 of FIG. 16, (2) the same low cost tester 1404 to test both the die 1406-1412 of FIG. 14 and the ICs 1706-1712 of FIG. 17, and (3) the same low cost tester 1504 to test both the die 1506-1512 of FIG. 15 and the ICs 1806-1812 of FIG. 18.

It is also important to note that the ability of the present disclosure to test the multiple die 1306-1312 in FIG. 13 and multiple ICs 1606-1612 in FIG. 16 in the time it would take to test a single die or IC, significantly reduces test time and therefore the cost to manufacture die and ICs. The number of die or ICs that may be tested at the same time is limited only by the capability of the tester to drive the test input buses of the multiple die or ICs, the ability to provide physical contact between the tester and multiple die or ICs, and, especially in regard to die on wafer testing, the ability to manage power consumption and heat generation during test. The low power test architectures 100 and 900 of the present disclosure contributes largely to the managing the power consumption and heat generation when compared to using conventional test architectures that do not address lowering the power and heat during test.

Figure 19:
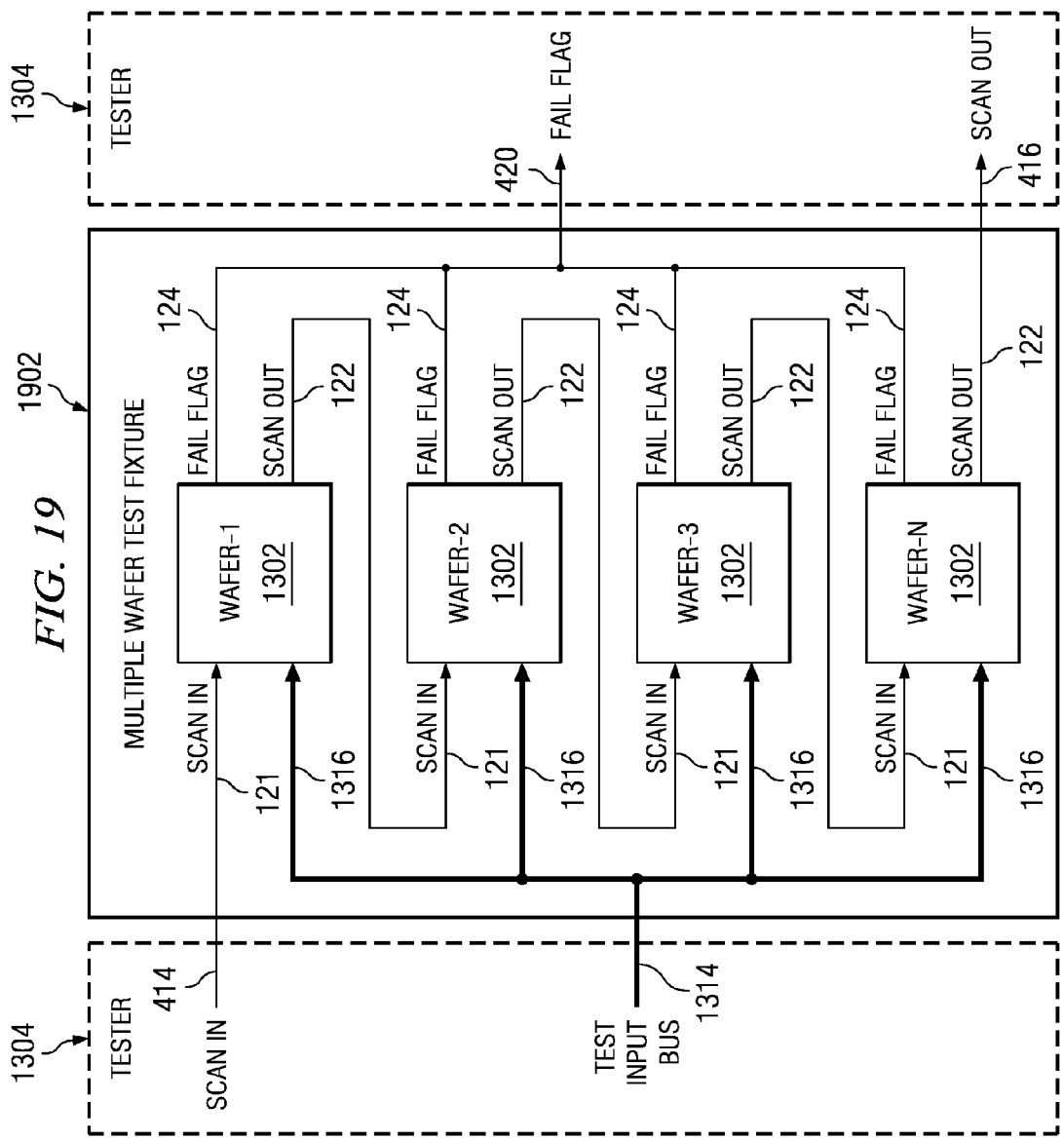
FIG. 19 illustrates an example of testing a plurality of FIG. 13 wafers on a multiple wafer test fixture according to the present disclosure.

FIG. 19 is provided to illustrate how the present disclosure may be further exploited to enable multiple wafers 1302 on a multiple wafer test fixture 1902 to be tested in parallel. The same tester 1304 used to test multiple die 1306-1312 on wafer 1302 in FIG. 13 is reused to test the multiple die 1306-1312 of the multiple wafers 1302 in FIG. 19. During test each wafer 1302 receives input from the tester's test input bus 1314 and outputs their fail flags 124 to the tester's wire-ORed fail flag input 420. At the end of test, the tester scan through each wafer 1302 using its scan input 414 and scan output 416 to retrieve fail flag 140 values from each die 1306-1312. Multiple ones of the other wafers 1402 and 1502 of FIGS. 14 and 15 could be similarly tested in parallel by similarly placing them into a multiple wafer test fixture adapted for them and applying tests using testers 1404 and 1504, respectively.

Although the present disclosure has been described in detail, it should be understood that various changes, substitutions and alterations can be made herein without departing from the spirit and scope of the disclosure as defined by the appended claims.

What is claimed is:

1. A semiconductor integrated circuit comprising:
    A. a substrate of semiconductor material;
    B. a stimulus bus of leads formed in the substrate;
    C. a response bus of leads formed in the substrate;
    D. a first multiplexer formed in the substrate having first and second inputs and an output, the second input being connected to the stimulus bus of leads;
    E. a second multiplexer formed in the substrate having first and second inputs and an output, the output being connected to the response bus of leads; and
    D. a serial scan path formed in the substrate, the scan path being formed of plural flip-flops connected in series, the scan path including a first section and a second section selectively connected in series, each section having a serial input and a serial output, the serial input of the first section being connected to the stimulus bus of leads, the serial output of the first section being connected to the first input of the first multiplexer and the first input of the second multiplexer, the serial input of the second section being connected to the output of the first multiplexer and the serial output of the second section being connected to the second input of the second multiplexer.

2. The circuit of claim 1 including a third multiplexer having first and second inputs and an output, the first input being connected to the serial output of the second section, and the second input being connected to the stimulus bus of leads, and the scan path includes a third section, the serial input of the third section being connected to the output of the third multiplexer, and the serial output of the third section being connected to a third input of the second multiplexer.

3. The circuit of claim 1 including control circuits connected to control leads formed in the substrate, the control circuits having control outputs connected to the multiplexers and scan path sections.

* * * * *